(12) United States Patent
Park et al.

(10) Patent No.: US 12,245,433 B2
(45) Date of Patent: Mar. 4, 2025

(54) SEMICONDUCTOR MEMORY DEVICE AND METHOD OF MANUFACTURING THE SAME

(71) Applicant: SK hynix Inc., Icheon-si (KR)

(72) Inventors: Sun Mi Park, Icheon-si (KR); Nam Kuk Kim, Icheon-si (KR); Eun Mee Kwon, Icheon-si (KR); Sang Wan Jin, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 510 days.

(21) Appl. No.: 17/512,047

(22) Filed: Oct. 27, 2021

(65) Prior Publication Data
US 2022/0367485 A1    Nov. 17, 2022

(30) Foreign Application Priority Data

May 14, 2021    (KR) .................. 10-2021-0062782

(51) Int. Cl.
*H10B 43/35*    (2023.01)
*H01L 25/065*    (2023.01)
*H10B 43/27*    (2023.01)

(52) U.S. Cl.
CPC .......... *H10B 43/35* (2023.02); *H01L 25/0652* (2013.01); *H10B 43/27* (2023.02)

(58) Field of Classification Search
CPC ........ H10B 43/35; H10B 43/27; H10B 43/40; H10B 43/50; H01L 25/0652; H01L 25/18; Y02D 10/00
See application file for complete search history.

(56) References Cited

U.S. PATENT DOCUMENTS

| 10,748,927 | B1 | 8/2020 | Tsutsumi et al. | |
| 2012/0168824 | A1* | 7/2012 | Lee | H10B 43/10 |
| | | | | 257/E21.41 |
| 2016/0260716 | A1* | 9/2016 | Lee | H01L 29/0649 |
| 2020/0303397 | A1* | 9/2020 | Cui | H10B 43/27 |
| 2022/0077174 | A1* | 3/2022 | Kuroda | H10B 41/20 |
| 2022/0285391 | A1* | 9/2022 | Yamabe | H10B 43/10 |

FOREIGN PATENT DOCUMENTS

| KR | 102128465 B1 | 7/2020 |
| KR | 1020210010210 A | 1/2021 |

* cited by examiner

*Primary Examiner* — Sitaramarao S Yechuri
(74) *Attorney, Agent, or Firm* — WILLIAM PARK & ASSOCIATES LTD.

(57) ABSTRACT

A semiconductor memory device, and a method of manufacturing the same, includes a lower stack in which a plurality of first interlayer insulating layers and first conductive layers are alternately stacked, a plurality of cell plugs passing through the lower stack in a vertical direction, an upper stack in which a plurality of second interlayer insulating layers and at least one second conductive layer are alternately stacked on the lower stack, a plurality of drain select plugs passing through the upper stack and being in contact with an upper portion of the plurality of cell plugs, and a separation pattern separating adjacent drain select plugs among the plurality of drain select plugs, wherein the separation pattern is in contact with a sidewall of each of the adjacent drain select plugs.

20 Claims, 26 Drawing Sheets

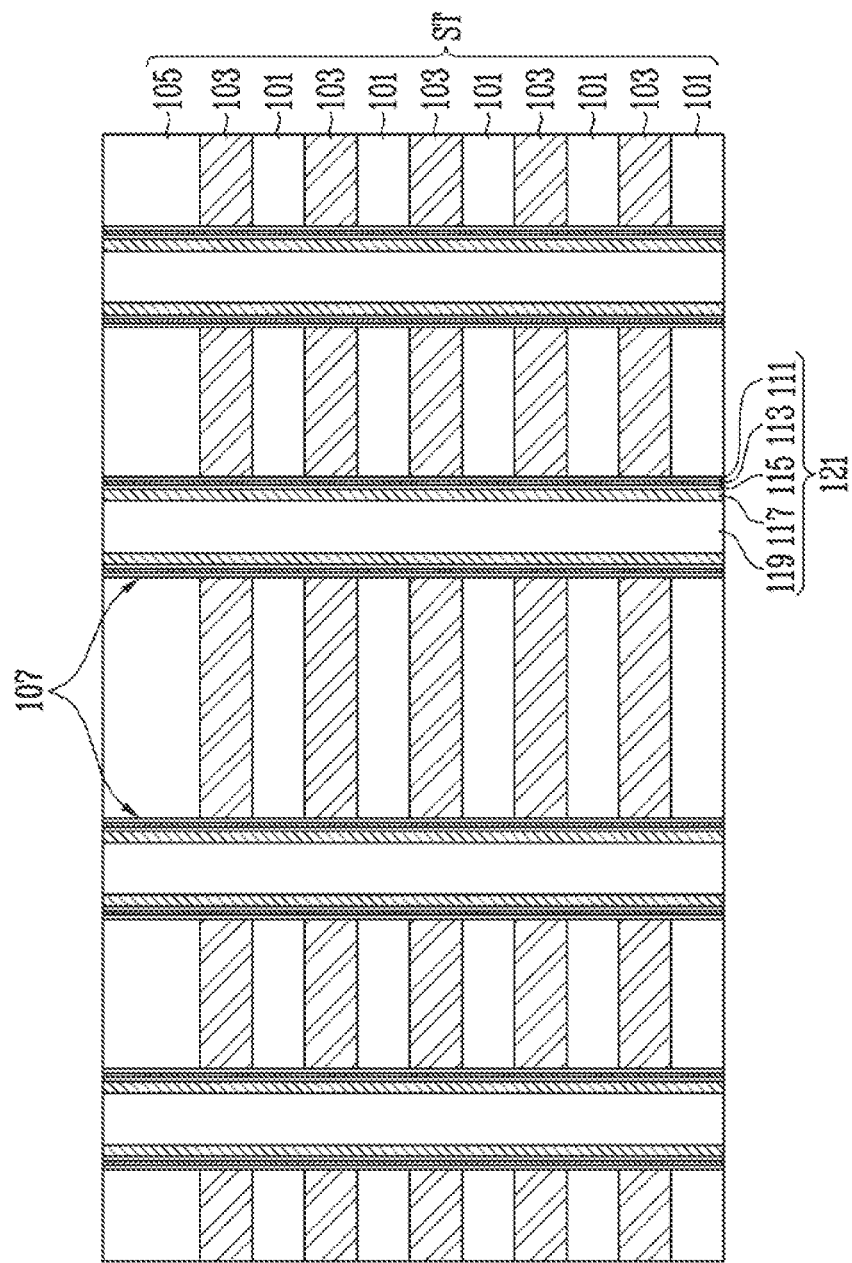

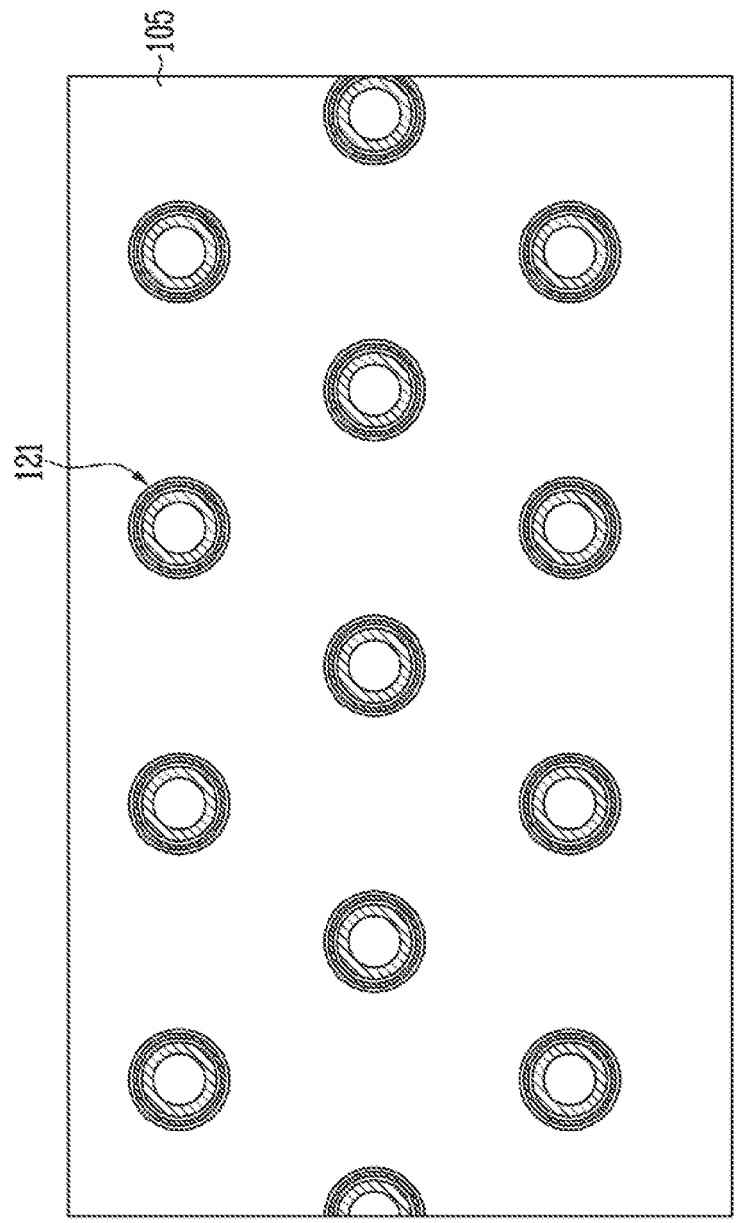

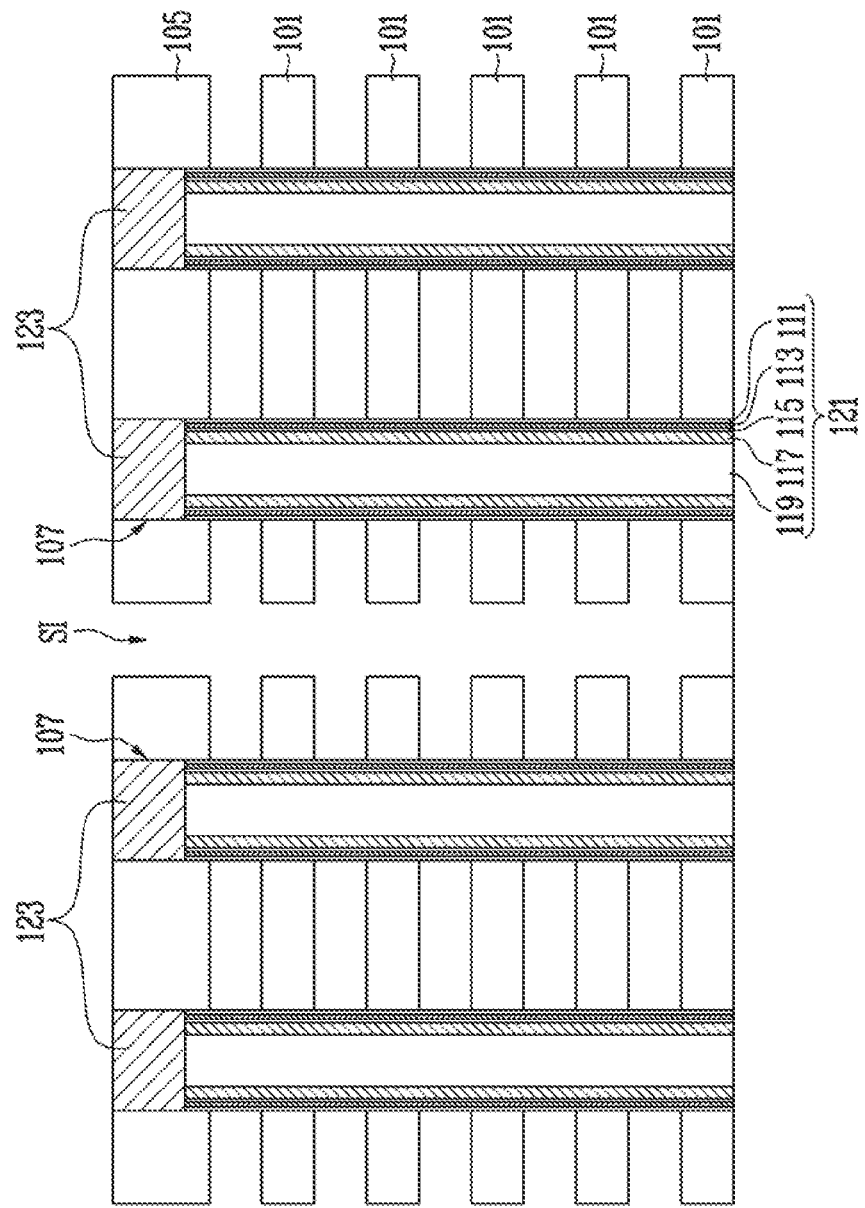

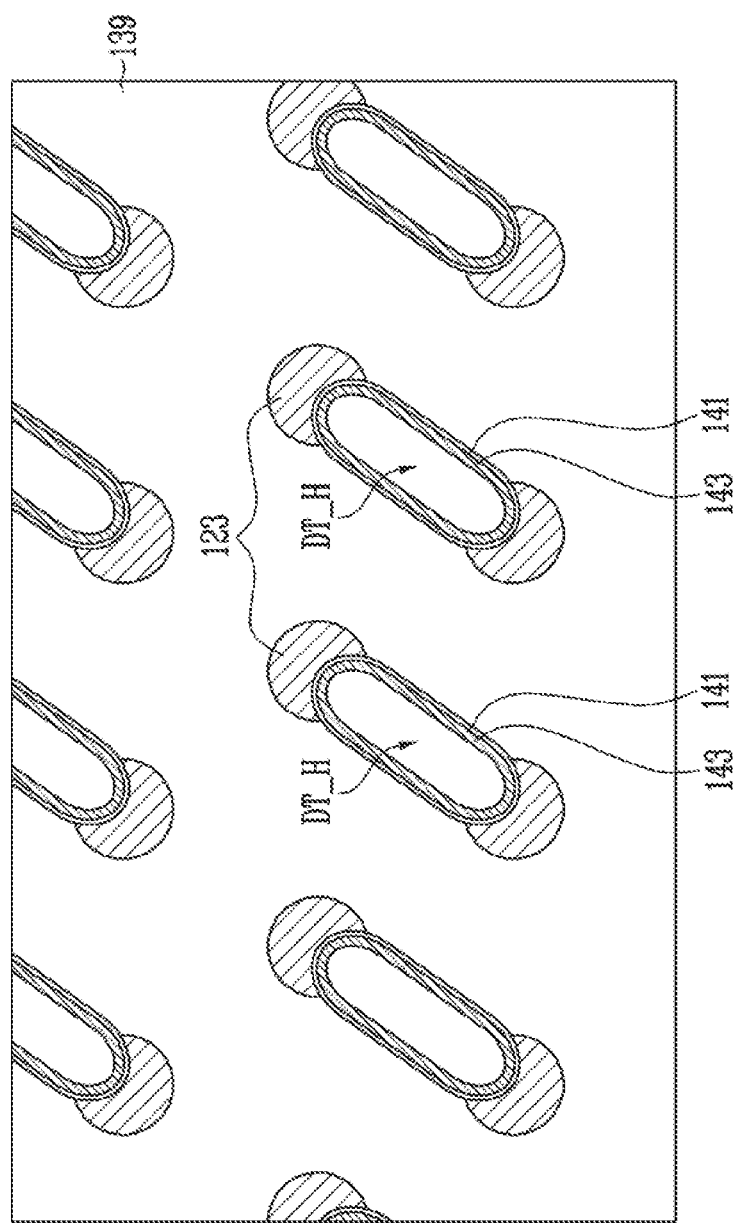

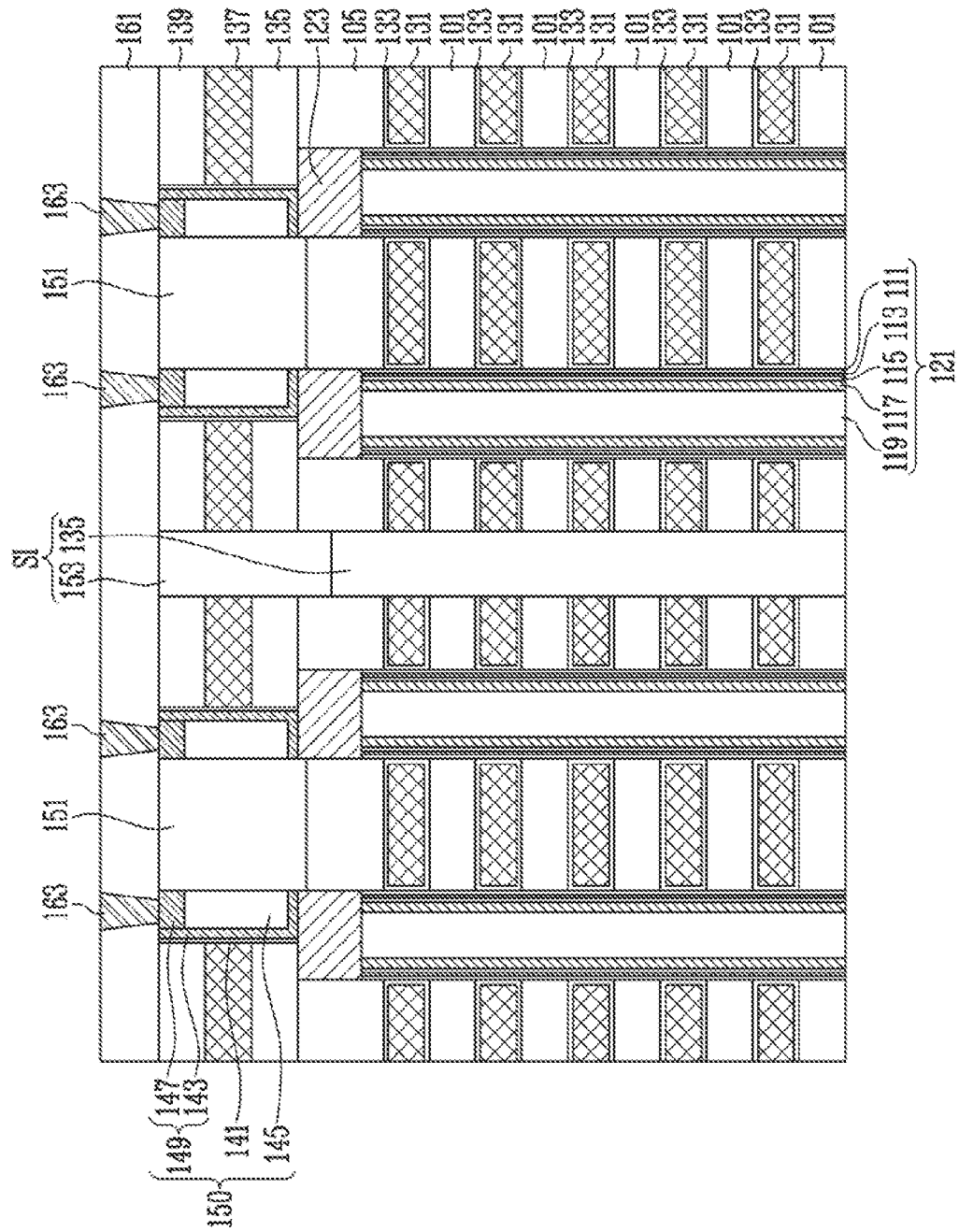

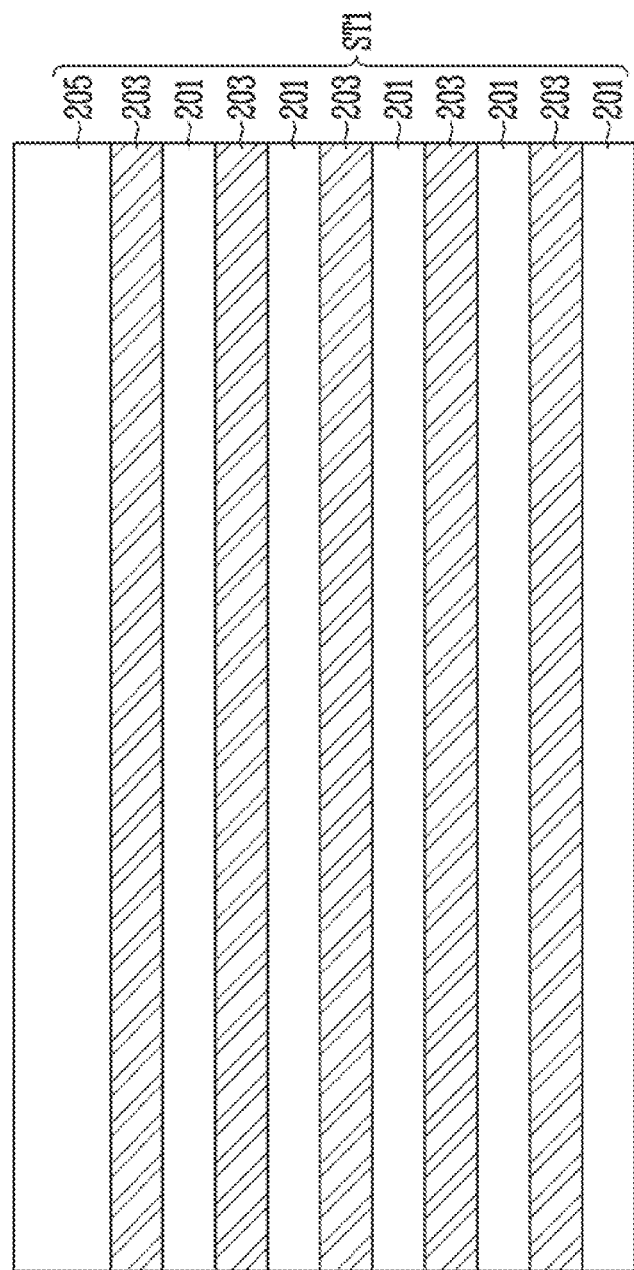

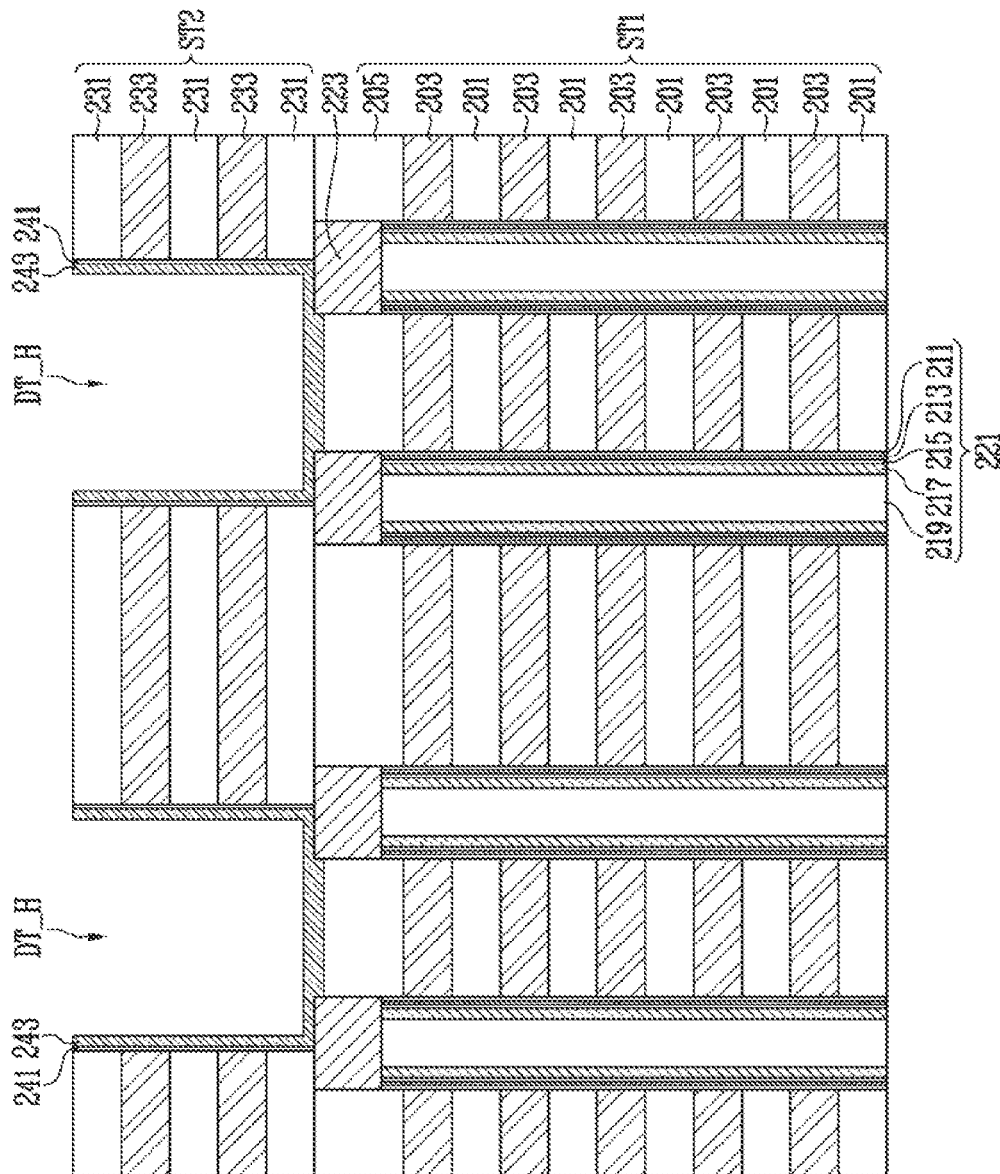

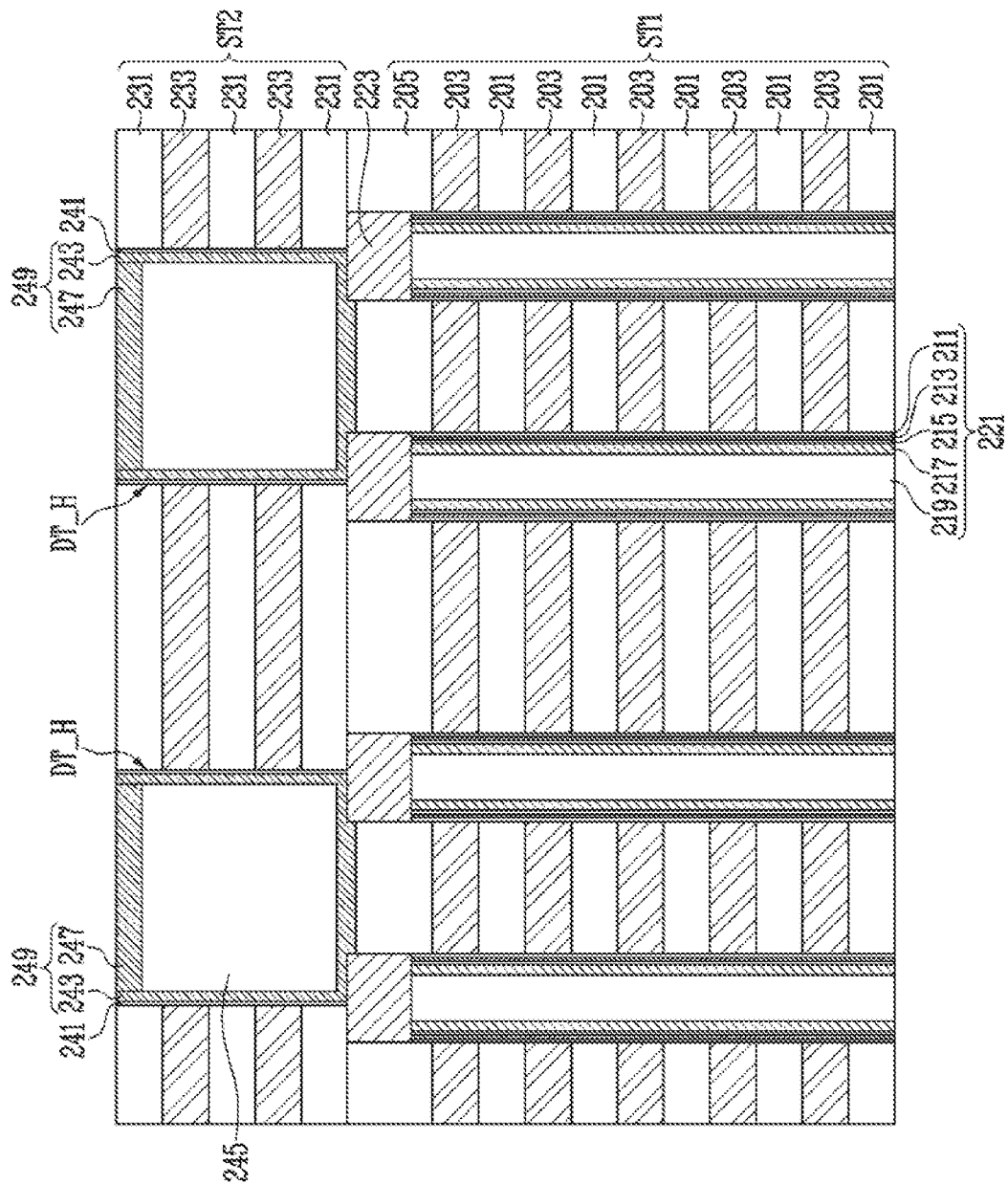

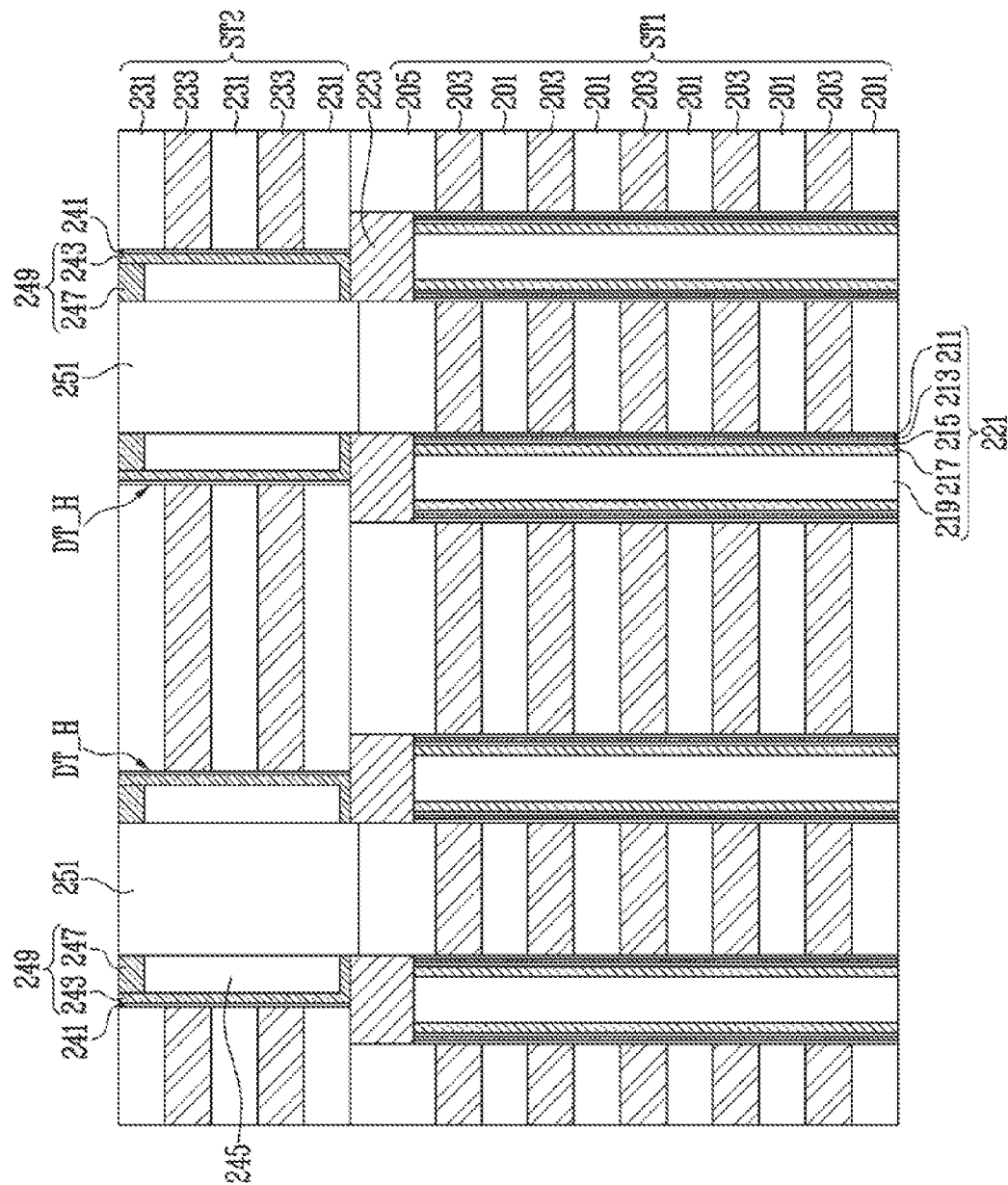

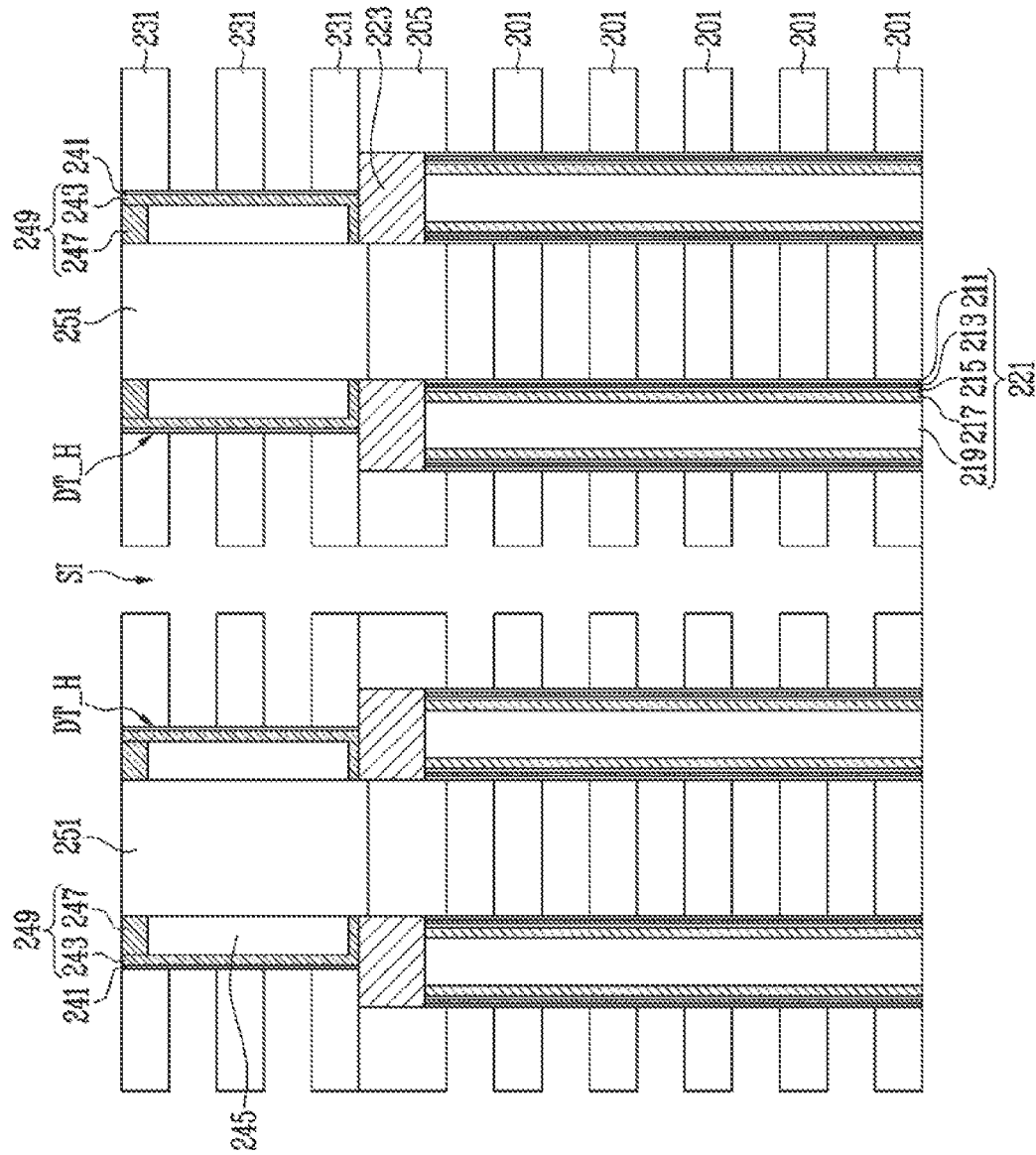

SEMICONDUCTOR MEMORY DEVICE AND METHOD OF MANUFACTURING THE SAME

CROSS-REFERENCE TO RELATED APPLICATION

The present application claims priority under 35 U.S.C. § 119(a) to Korean patent application number 10-2021-0062782, filed on May 14, 2021, in the Korean Intellectual Property Office, the entire disclosure of which is incorporated herein by reference.

BACKGROUND

1. Technical Field

The present disclosure relates to an electronic device, and more particularly, to a semiconductor memory device with a vertical channel structure and a method of manufacturing the same.

2. Related Art

Recently, a paradigm for a computer environment has been transformed into ubiquitous computing, which enables a computer system to be used virtually anywhere and at any time. Therefore, use of portable electronic devices such as mobile phones, digital cameras, and notebook computers is rapidly increasing. Such portable electronic devices generally use semiconductor memory systems that use a memory device, that is, a data storage device. The data storage device may be used as a main storage device or an auxiliary storage device of the portable electronic device.

A data storage device using a semiconductor memory device has advantages in that stability and durability are excellent because there is no mechanical driver, access speed of information is very fast, and power consumption is low. Examples of memory systems having such advantages include a data storage device includes a universal serial bus (USB) memory device, a memory card having various interfaces, a solid state drive (SSD), and the like.

A semiconductor memory device is generally classified as a volatile memory device or a nonvolatile memory device.

The write speed and read speed of a nonvolatile memory device is relatively slow, however, the nonvolatile memory device maintains stored data even when a supply of power is cut off. Therefore, nonvolatile memory devices are used to store data to be maintained regardless of power supply. Nonvolatile memory devices may include read only memory (ROM), mask ROM (MROM), programmable ROM (PROM), erasable programmable ROM (EPROM), electrically erasable programmable ROM (EEPROM), flash memory, phase change random access memory (PRAM), magnetic RAM (MRAM), resistive RAM (RRAM), ferroelectric RAM (FRAM), and the like. Flash memory is generally classified as NOR type or NAND type flash memory.

SUMMARY

An embodiment of the present disclosure is directed to a semiconductor memory device and a method of manufacturing the same capable of separating select lines in a memory cell array having a vertical channel structure.

According to an embodiment of the present disclosure, a semiconductor memory device includes a lower stack in which a plurality of first interlayer insulating layers and first conductive layers are alternately stacked, a plurality of cell plugs passing through the lower stack in a vertical direction, an upper stack in which a plurality of second interlayer insulating layers and at least one second conductive layer are alternately stacked on the lower stack, a plurality of drain select plugs passing through the upper stack and being in contact with an upper portion of the plurality of cell plugs, and a separation pattern separating adjacent drain select plugs among the plurality of drain select plugs, wherein the separation pattern is in contact with a sidewall of each of the adjacent drain select plugs.

According to an embodiment of the present disclosure, a method of manufacturing a semiconductor memory device includes: forming a plurality of cell plugs passing through a lower stack in which a plurality of first interlayer insulating layers and a plurality of first conductive layers are alternately stacked in a vertical direction; forming an upper stack in which a plurality of second interlayer insulating layers and at least one second conductive layer are alternately stacked on the lower stack; etching the upper stack to form a plurality of drain select transistor pattern holes, each drain select transistor pattern hole exposing an upper portion of at least one of the plurality of cell plugs; forming a drain select plug in each of the plurality of drain select transistor pattern holes; and forming a separation pattern passing through the upper stack in a linear shape and separating the drain select plug into two ends.

According to an embodiment of the present disclosure, a method of manufacturing a semiconductor memory device includes: forming a plurality of cell plugs passing through a lower stack in which a plurality of first interlayer insulating layers and a plurality of first sacrificial layers are alternately stacked in a vertical direction; forming an upper stack in which a plurality of second interlayer insulating layers and a plurality of second sacrificial layers are alternately stacked on the lower stack; etching the upper stack to form a plurality of drain select transistor pattern holes, each drain select transistor pattern hole exposing an upper portion of at least one of the plurality of cell plugs; forming a drain select plug in each of the plurality of drain select transistor pattern holes; forming a separation pattern passing through the upper stack in a linear shape and separating the drain select plug into two ends; forming a slit passing through the upper stack and the lower stack to expose the first sacrificial layers and the second sacrificial layers, and removing the exposed first sacrificial layers and second sacrificial layers; and forming a conductive pattern in a space where the first sacrificial layers and the second sacrificial layers are removed.

According to the present technology, after forming a gate pattern for a drain select transistor on an upper end of an adjacent vertical channel structure, a separation pattern separating the gate pattern into two ends may be formed. Therefore, a margin of an etching process for forming the separation pattern may be secured, and thus a process may be easily performed.

BRIEF DESCRIPTION OF THE DRAWINGS

FIGS. 5A to 5L are cross-sectional views and plan views of a semiconductor memory device illustrating a method of manufacturing the semiconductor memory device according to an embodiment of the present disclosure.

FIGS. 6A to 6I are cross-sectional views of a semiconductor memory device illustrating a method of manufacturing the semiconductor memory device according to another embodiment of the present disclosure.

DETAILED DESCRIPTION

Specific structural or functional descriptions of embodiments are disclosed in the present specification or application to better illustrate the concept of the present disclosure. The disclosed embodiments are not exhaustive and may be carried out in various forms and should not be construed as being limiting.

Hereinafter, embodiments of the present disclosure will be described with reference to the accompanying drawings in order to allow those of ordinary skill in the art to implement the technical idea of the present disclosure.

Figure 1:
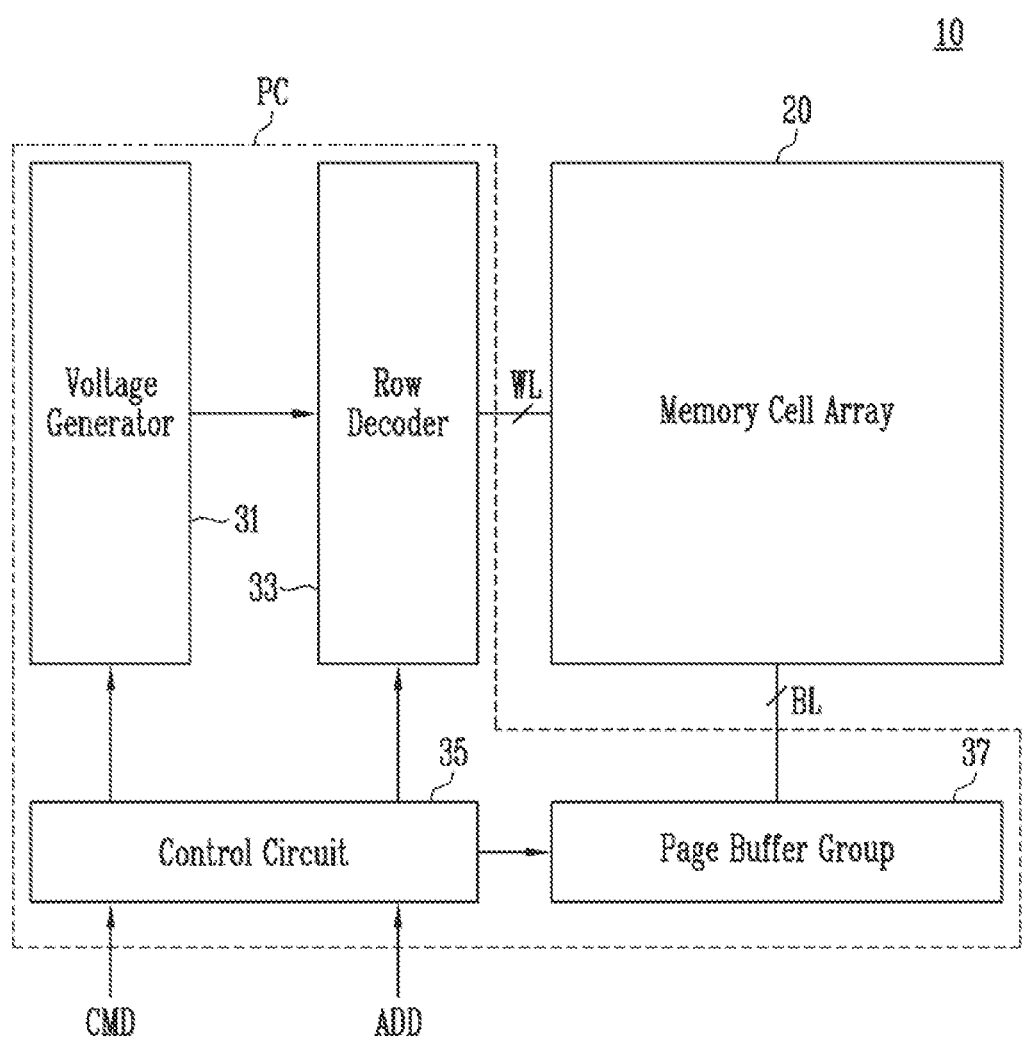
FIG. 1 is a block diagram illustrating a semiconductor memory device according to an embodiment of the present disclosure.

FIG. 1 is a block diagram illustrating a semiconductor memory device 10 according to an embodiment of the present disclosure.

Referring to FIG. 1, the semiconductor memory device includes a peripheral circuit PC and a memory cell array 20.

The peripheral circuit PC may be configured to control a program operation for storing data in the memory cell array 20, a read operation for outputting data stored in the memory cell array 20, and an erase operation for erasing data stored in the memory cell array 20.

In an embodiment, the peripheral circuit PC may include a voltage generator 31, a row decoder 33, a control circuit 35, and a page buffer group 37.

The memory cell array 20 may include a plurality of memory blocks. The memory cell array 20 may be connected to the row decoder 33 through word lines WL, and may be connected to the page buffer group 37 through bit lines BL.

The control circuit 35 may control the voltage generator 31, the row decoder 33, and the page buffer group 37 in response to a command CMD and an address ADD.

The voltage generator 31 may generate various operation voltages such as an erase voltage, a ground voltage, a program voltage, a verify voltage, a pass voltage, and a read voltage used for the program operation, the read operation, and the erase operation in response to control of the control circuit 35.

The row decoder 33 may select a memory block in response to the control of the control circuit 35. The row decoder 33 may be configured to apply the operation voltages to the word lines WL connected to the selected memory block.

The page buffer group 37 may be connected to the memory cell array 20 through the bit lines BL. The page buffer group 37 may temporarily store data received from an input/output circuit (not shown) during the program operation in response to the control of the control circuit 35. The page buffer group 37 may sense a voltage or a current of the bit lines BL during the read operation or a verify operation in response to the control of the control circuit 35. The page buffer group 37 may select the bit lines BL in response to the control of the control circuit 35.

Structurally, the memory cell array 20 may overlap a portion of the peripheral circuit PC.

Figure 2:
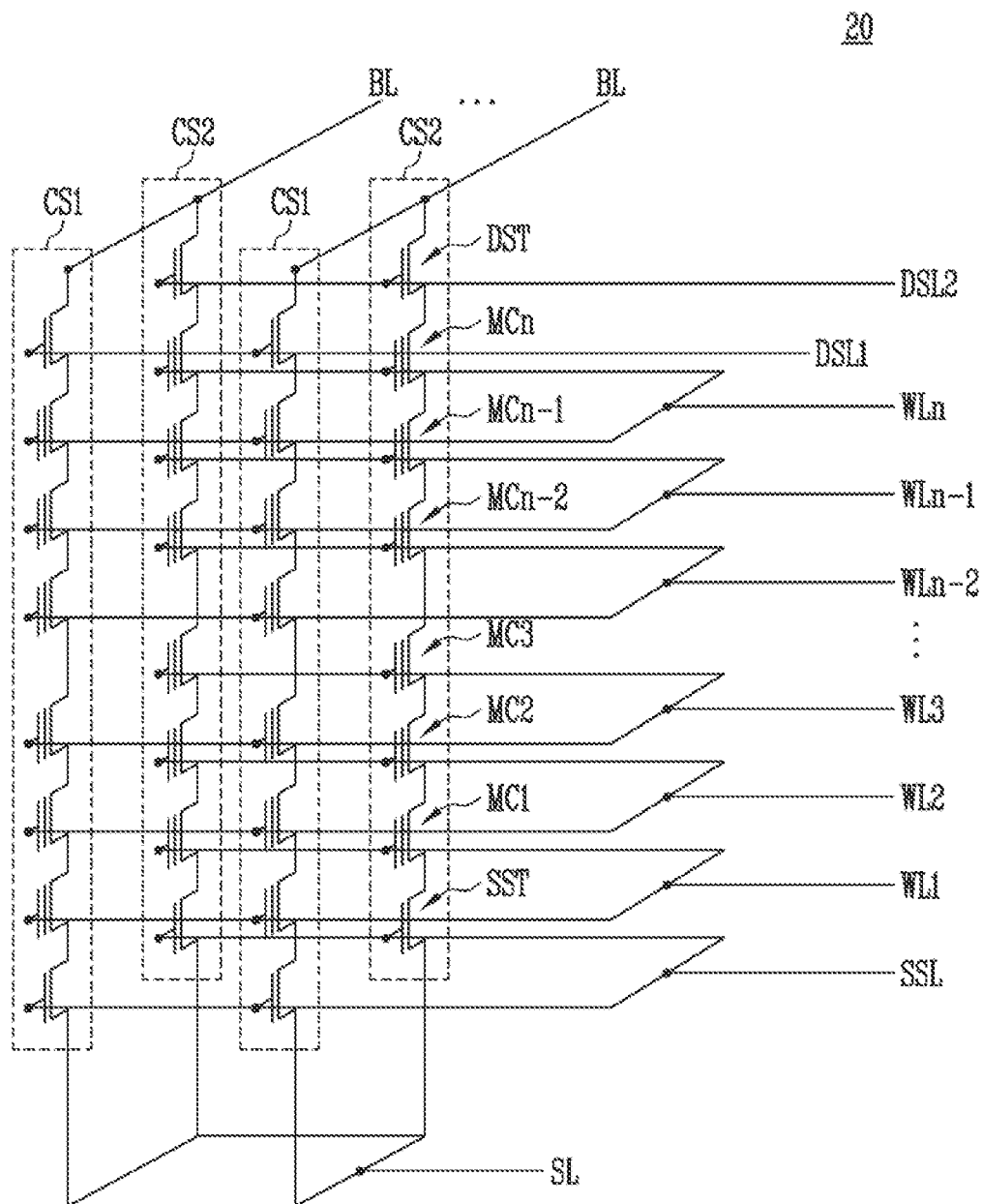
FIG. 2 is a circuit diagram illustrating a memory cell array of FIG. 1.

FIG. 2 is a circuit diagram illustrating the memory cell array 20 of FIG. 1.

Referring to FIG. 2, the memory cell array 20 may include a plurality of cell strings CS1 and CS2 connected between a source line SL and a plurality of bit lines BL. The plurality of cell strings CS1 and CS2 may be commonly connected to a plurality of word lines WL1 to WLn.

Each of the plurality of cell strings CS1 and CS2 may include at least one source select transistor SST connected to the source line SL, at least one drain select transistor DST connected to the bit line BL, and a plurality of memory cells MC1 to MCn connected in series between the source select transistor SST and the drain select transistor DST.

Gates of the plurality of memory cells MC1 to MCn may be respectively connected to the plurality of word lines WL1 to WLn that are spaced apart from each other and stacked. The plurality of word lines WL1 to WLn may be disposed between a source select line SSL and two or more drain select lines DSL1 and DSL2. The two or more drain select lines DSL1 and DSL2 may be spaced apart from each other at the same level.

A gate of the source select transistor SST may be connected to the source select line SSL. A gate of the drain select transistor DST may be connected to a drain select line corresponding to the gate of the drain select transistor DST.

The source line SL may be connected to a source of the source select transistor SST. A drain of the drain select transistor DST may be connected to a bit line corresponding to the drain of the drain select transistor DST.

The plurality of cell strings CS1 and CS2 may be divided into string groups respectively connected to the two or more drain select lines DSL1 and DSL2. Cell strings connected to the same bit line may be independently controlled by different drain select lines. In addition, cell strings connected to the same drain select line may be independently controlled by different bit lines.

In an embodiment, the two or more drain select lines DSL1 and DSL2 may include a first drain select line DSL1 and a second drain select line DSL2. The plurality of cell strings CS1 and CS2 may include a first cell string CS1 of a first string group connected to the first drain select line DSL1 and a second string CS2 of a second string group connected to the second drain select line DSL2.

Figure 3:
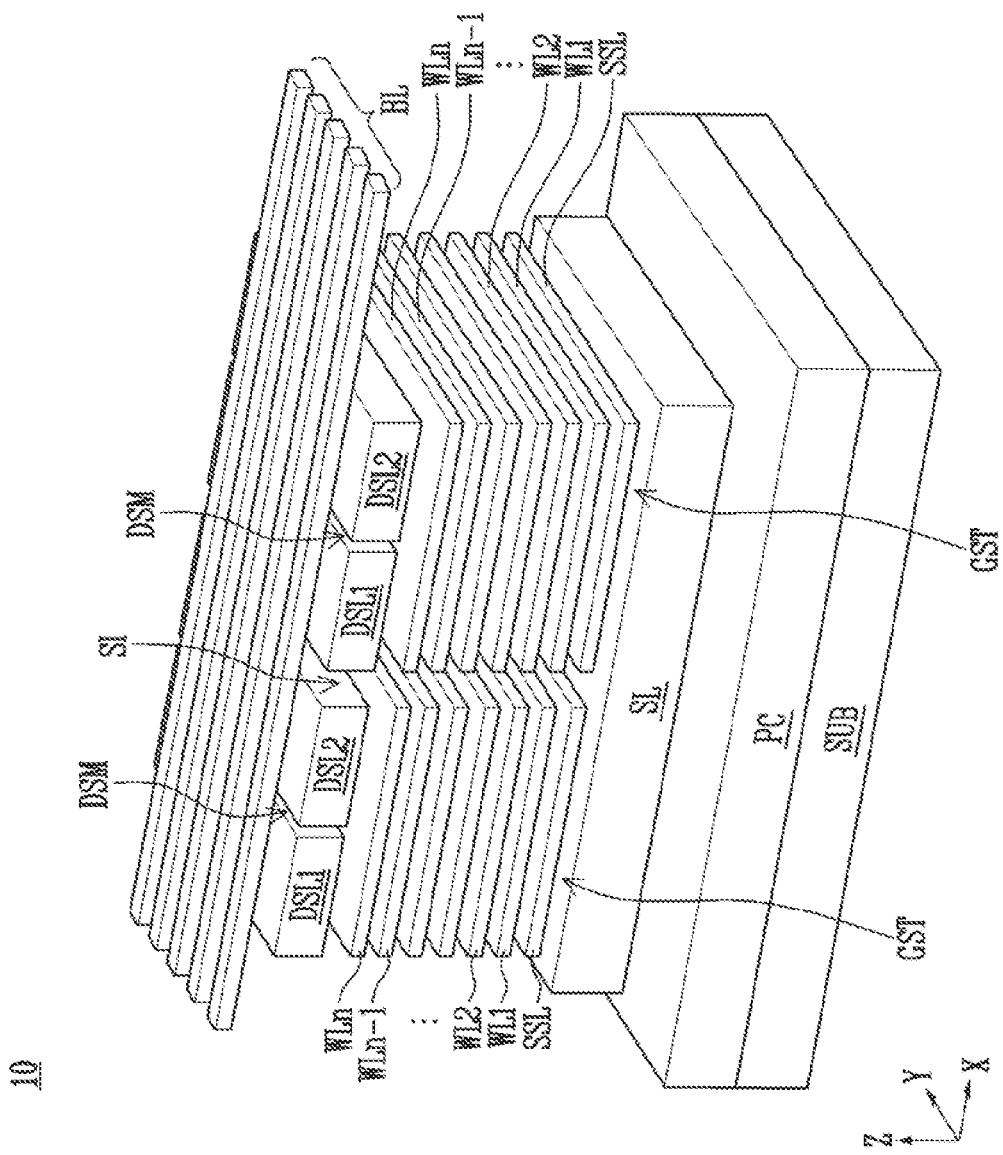
FIG. 3 is a perspective view schematically illustrating a semiconductor memory device according to embodiments of the present disclosure.

FIG. 3 is a perspective view schematically illustrating the semiconductor memory device 10 of FIG. 1 according to embodiments of the present disclosure.

Referring to FIG. 3, the semiconductor memory device 10 may include the peripheral circuit PC disposed on a substrate SUB and gate stacks GST overlapping the peripheral circuit PC.

Each of the gate stacks GST may include the source select line SSL, the plurality of word lines WL1 to WLn, and the two or more drain select lines DSL1 and DSL2 separated from each other at the same level by a separation structure DSM.

The source select line SSL and the plurality of word lines WL1 to WLn may extend in a first direction X and a second direction Y, and may be formed in a flat plate shape parallel to an upper surface of the substrate SUB. The first direction X may be a direction in which an X-axis of an XYZ coordinate system is directed, and the second direction Y may be a direction in which a Y-axis of the XYZ coordinate system is directed.

The plurality of word lines WL1 to WLn may be spaced apart from each other and stacked in a third direction Z. The third direction Z may be a direction in which a Z-axis of the XYZ coordinate system is directed. The plurality of word lines WL1 to WLn may be disposed between the two or more drain select lines DSL1 and DSL2 and the source select line SSL.

The gate stacks GST may be separated from each other by a slit SI. The separation structure DSM may be formed shorter in the third direction Z than the slit SI and may overlap the plurality of word lines WL1 to WLn.

Each of the separation structure DSM and the slit SI may extend in a straight line shape, a zigzag shape, or a wave shape. Widths of each of the separation structures DSM and the slit SI may be variously changed according to different designs.

The source select line SSL according to an embodiment may be disposed closer to the peripheral circuit PC than the two or more drain select lines DSL1 and DSL2.

The semiconductor memory device 10 may include the source line SL disposed between the gate stacks GST and the peripheral circuit PC, and the plurality of bit lines BL may be spaced farther from the peripheral circuit PC than the source line SL. The gate stacks GST may be disposed between the plurality of bit lines BL and the source line SL.

Figure 4:
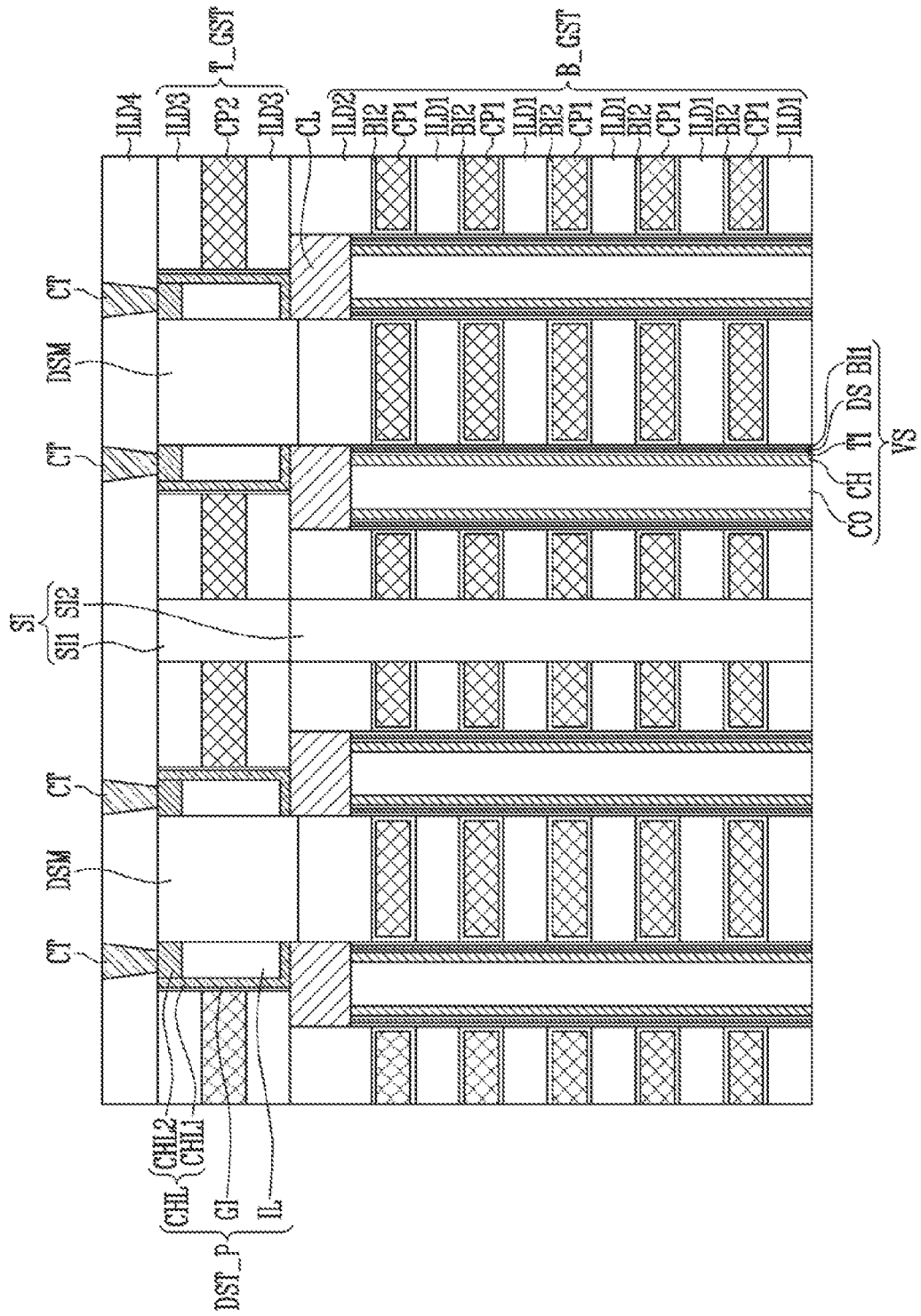
FIG. 4 is a cross-sectional view of a semiconductor memory device illustrating a portion of a memory cell array of the semiconductor memory device according to an embodiment of the present disclosure.

FIG. 4 is a cross-sectional view of a semiconductor memory device illustrating a portion of a memory cell array of the semiconductor memory device according to an embodiment of the present disclosure.

Referring to FIG. 4, the semiconductor memory device may include a lower stack B_GST, an upper stack T_GST, a vertical channel structure VS, a drain select transistor pattern DST_P, and a contact plug CT.

The lower stack B_GST may include conductive layers CP1 and insulating layers ILD1 and ILD2 that are alternately stacked. The conductive layers CP1 may be a gate electrode of a memory cell, or a word line. The conductive layers CP1 may include a conductive material such as polysilicon, tungsten, molybdenum, or a metal. The insulating layers ILD1 and ILD2 may be for insulating the stacked conductive layers CP1 from each other. The insulating layers ILD1 and ILD2 may include an insulating material such as an oxide, nitride, or an air gap. The insulating layer ILD2 disposed at the uppermost portion among the insulating layers ILD1 and ILD2 may be formed to be thicker than the remaining insulating layers ILD1. The lower stack B_GST may further include a second blocking insulating layer BI2 surrounding a surface of the conductive layers CP1. The second blocking insulating layer BI2 may be disposed between an interface between the conductive layers CP1 and the insulating layers ILD1 and ILD2 and an interface between the conductive layers CP1 and the vertical channel structure VS.

The vertical channel structure VS may be disposed to pass through the lower stack B_GST in a vertical direction. That is, the vertical channel structure VS may extend in the vertical direction and may be surrounded by the conductive layers CP1.

The vertical channel structure VS may include a core insulating layer CO, a channel layer CH, a tunnel insulating layer TI, a data storage layer DS, and a first blocking insulating layer BI1 extending in the vertical direction. The core insulating layer CO may be formed of an insulating layer such as an oxide layer. The channel layer CH may surround the core insulating layer CO and may extend in the vertical direction. The channel layer CH may include a semiconductor layer. In an embodiment, the channel layer CH may include silicon. The tunnel insulating layer TL may surround the channel layer CH and may extend in the vertical direction. The tunnel insulating layer TL may be formed of a silicon oxide layer capable of charge tunneling. The data storage layer DS may surround the tunnel insulating layer TL and may extend in the vertical direction. The data storage layer DS may be formed of a material layer capable of storing data changed using Fowler-Nordheim tunneling. In an embodiment, the data storage layer DS may be formed of a charge trap nitride layer. The first blocking insulating layer BI1 may surround the data storage layer DS and extend in the vertical direction. The first blocking insulating layer BI1 may include an oxide layer capable of charge blocking.

The semiconductor memory device may further include a capping layer CL that is in contact with an upper portion of the vertical channel structure VS and passes through the insulating layer ILD2. The capping layer CL may be formed of a conductive material, and may include, for example, a polysilicon layer. The capping layer CL may be included in the vertical channel structure VS.

The vertical channel structure VS may be defined as a cell plug of the memory cell array. The cell plug may be a structure corresponding to the source select transistor SST and the plurality of memory cells MC1 to MCn among the cell strings CS1 and CS2 shown in FIG. 2.

The upper stack T_GST may be stacked on the lower stack B_GST. The upper stack T_GST may include a conductive layer CP2 and an insulating layer ILD3 stacked on and under the conductive layer CP2. In an embodiment of the present disclosure, it has been illustrated and described that one conductive layer CP2 is disposed, but a plurality of conductive layers CP2 may be sequentially disposed, and the insulating layer ILD3 may be disposed between the conductive layers CP2. The conductive layer CP2 may be a gate electrode of the drain select transistor, or a drain select line. The conductive layer CP2 may include a conductive material such as polysilicon doped with an N-type impurity, tungsten, tungsten silicide, molybdenum, or a metal.

Each of the drain select transistor patterns DST_P passes through the upper stack T_GST and is in contact with one vertical channel structure VS. For example, the drain select transistor pattern DST_P may be disposed to be in contact with the capping layer CL.

The drain select transistor pattern DST_P may include an insulating pattern IL, a channel layer surrounding one sidewall, an upper surface, and a lower surface of the insulating pattern IL, and a gate insulating layer GI that is in contact with a sidewall of the channel layer CHL.

The drain select transistor pattern DST_P may be formed in a semi-cylindrical shape. For example, one sidewall of the insulating pattern IL may be formed in a curved surface, and another sidewall may be formed in a flat surface, as illustrated in FIG. 5I. The channel layer CHL may be formed to be in contact with a curved portion, which is one sidewall, an upper surface, and a lower surface of the insulating pattern IL.

The channel layer CHL may include a first channel layer CHL1 that is in contact with the curved portion which is one sidewall and the lower surface of the insulating pattern IL and is in contact with the capping layer CL, and a second channel layer CHL2 that is in contact with the upper surface of the insulating pattern IL. The channel layer CHL may be formed of a conductive material, and in an embodiment, the channel layer CHL may be formed of a polysilicon layer.

The gate insulating layer GI may be formed of an oxide layer or an ONO layer in which an oxide layer, a nitride layer, and an oxide layer are sequentially stacked.

The drain select transistor pattern DST_P may be defined as a drain select plug of the memory cell array. The drain select plug may be a structure corresponding to the drain select transistor DST among the cell strings CS1 and CS2 shown in FIG. 2.

The semiconductor memory device may further include contact plugs CT passing through an upper insulating layer ILD4 formed on the upper stack T_GST and being in contact with the second channel layer CHL2 of the drain select transistor pattern DST_P. The contact plugs CT may be connected to the bit lines BL of FIG. 3.

FIGS. 5A to 5L are cross-sectional views and plan views of a semiconductor memory device illustrating a method of manufacturing the semiconductor memory device according to an embodiment of the present disclosure.

Figure 5A:
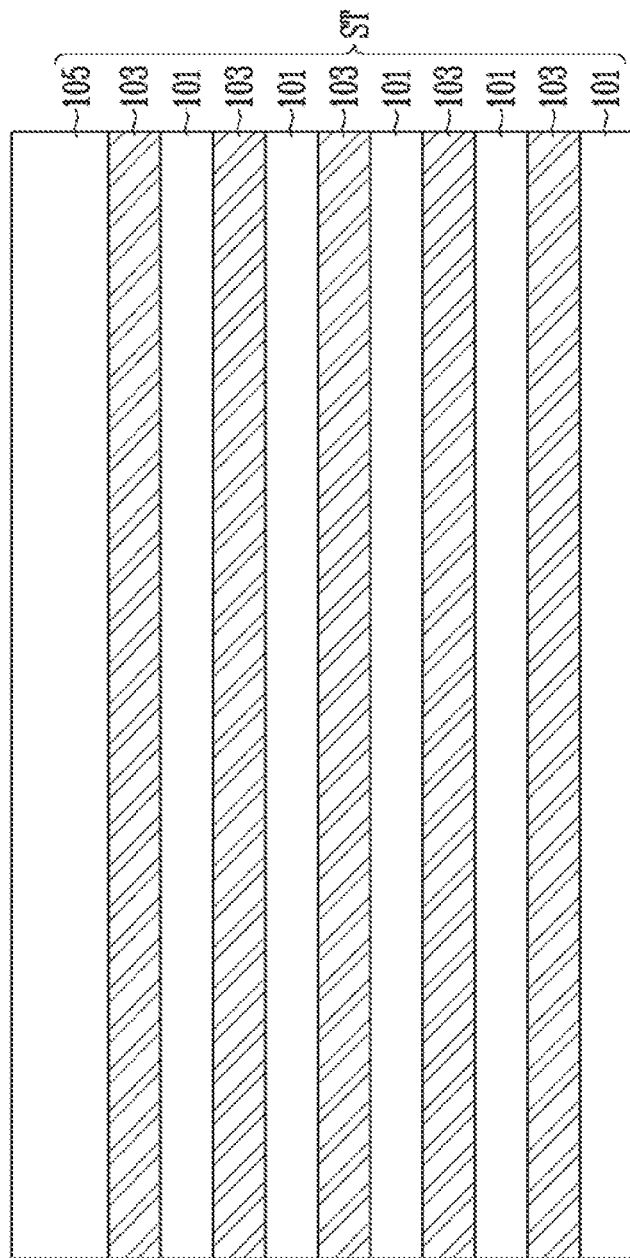

Referring to FIG. 5A, a stack ST in which first interlayer insulating layers 101 and 105 and sacrificial layers 103 are alternately stacked may be formed. The stack ST may be formed on a substrate (not shown) including a peripheral circuit.

The sacrificial layers 103 may be formed of a material different from that of the first interlayer insulating layers 101 and 105. For example, the first interlayer insulating layers 101 and 105 may be formed of an oxide such as a silicon oxide layer. The sacrificial layers 103 may be formed of a material having an etch rate that is different from that of the first interlayer insulating layers 101 and 105. For example, the sacrificial layers 103 may be formed of a nitride such as a silicon nitride layer.

The first interlayer insulating layer 105 disposed at the uppermost portion may be formed to be thicker than the other first interlayer insulating layers 101.

Referring to FIG. 5B, a mask pattern (not shown) in which a region where a vertical channel structure is to be formed is formed on the stack ST, and an etching process using the mask pattern is performed to form a plurality of channel holes 107 passing through the stack ST.

Thereafter, a vertical channel structure 121 is formed in each of the channel holes 107. The vertical channel structure 121 may be formed by sequentially stacking a first blocking insulating layer 111, a data storage layer 113, a tunnel insulating layer 115, a channel layer 117, and a core insulating layer 119 on a sidewall of each of the channel holes 107.

The first blocking insulating layer 111 may be formed on a sidewall of each of the channel holes 107. The first blocking insulating layer 111 may include an oxide layer capable of charge blocking. In an embodiment, the blocking insulating layer may be formed of aluminum oxide $Al_2O_3$. The data storage layer 113 may be formed on a sidewall of the first blocking insulating layer 111. The data storage layer 113 may be formed of a charge trap layer, a material layer including a conductive nanodot, or a phase change material layer. For example, the data storage layer 113 may store data changed using Fowler-Nordheim tunneling. To this end, the data storage layer 113 may be formed of a silicon nitride layer capable of charge trapping. The tunnel insulating layer 115 may be formed on a sidewall of the data storage layer 113. The tunnel insulating layer 115 may be formed of a silicon oxide layer capable of charge tunneling. The channel layer 117 may be formed on a sidewall of the tunnel insulating layer 115. The channel layer 117 may include a semiconductor layer. In an embodiment, the channel layer 117 may include silicon. The core insulating layer 119 may be formed by filling a central region of the channel holes 107. The core insulating layer 119 may be formed of an oxide layer.

The vertical channel structure 121 may be defined as the cell plug of the memory cell array. The cell plug may be a structure corresponding to the source select transistor SST and the plurality of memory cells MC1 to MCn among the cell strings CS1 and CS2 shown in FIG. 2.

FIG. 5C is a plan view of a semiconductor memory device on which the process step related to FIG. 5B described above is performed. Referring to FIG. 5C, the plurality of vertical channel structures 121 may be regularly arranged to be spaced apart from each other by a predetermined distance.

Figure 5D:
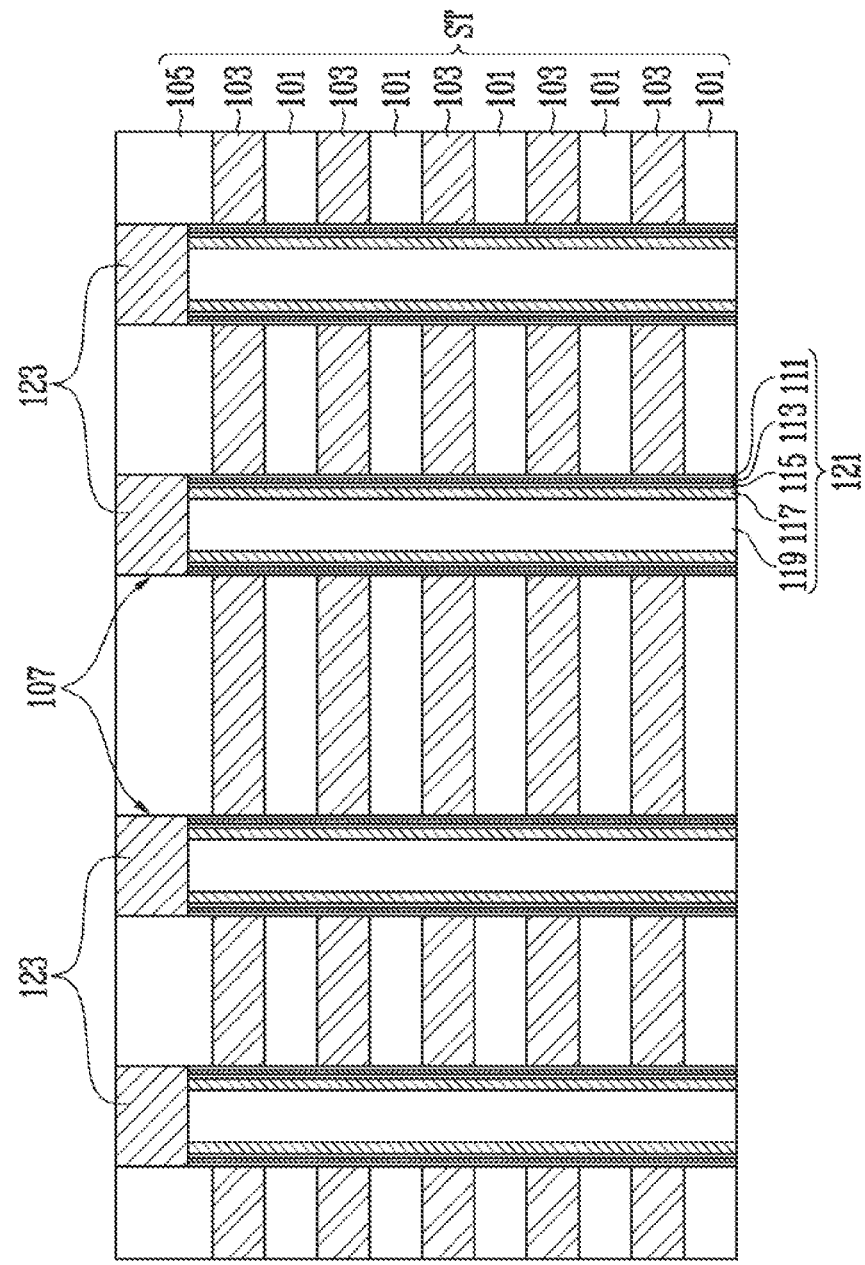

Referring to FIG. 5D, an upper portion of the plurality of vertical channel structures 121 may be etched at a predetermined thickness. For example, the upper portion of the plurality of vertical channel structures 121 may be etched at the predetermined thickness so that a height of an upper surface of the plurality of vertical channel structures 121 is higher than a height of an upper surface of the sacrificial layer 103 positioned at the uppermost portion and is lower than a height of an upper surface of the first interlayer insulating layer 105 positioned at the uppermost portion.

Thereafter, a capping layer 123 may be formed in a space where the plurality of vertical channel structures 121 are etched and removed. In an embodiment, the capping layer 123 may be formed of a doped semiconductor layer. The capping layer 123 may be defined as a configuration included in the vertical channel structure 121.

Referring to FIG. 5E, a slit SI passing through the stack ST shown in FIG. 5D may be formed. A sidewall of the sacrificial layers 103 shown in FIG. 5D may be exposed by the slit SI. Thereafter, the sacrificial layers 103 shown in FIG. 5D may be removed through the slit SI. Accordingly, openings exposing a side portion of the vertical channel structure 121 may be formed. Openings may be defined between the first interlayer insulating layers 101 and 105.

Figure 5F:
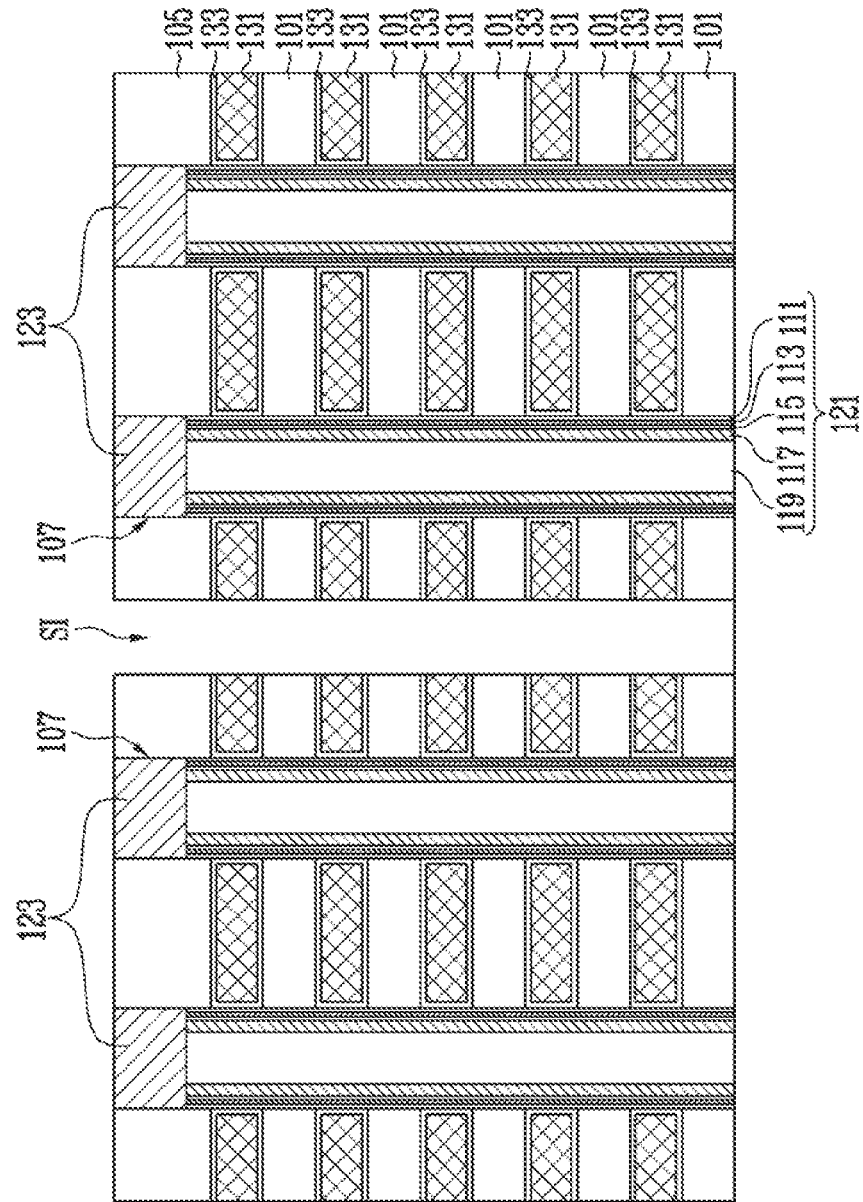

Referring to FIG. 5F, conductive layers 131 may be filled in a space where the sacrificial layers are removed, that is, the openings. For example, after a conductive material is deposited to fill the openings, the conductive material inside the slit SI may be removed so that the conductive material is separated into the conductive layers 131 by the slit SI. Before the conductive layers 131 are filled in the openings, a second blocking insulating layer 133 may be formed along a surface of the openings.

Figure 5G:
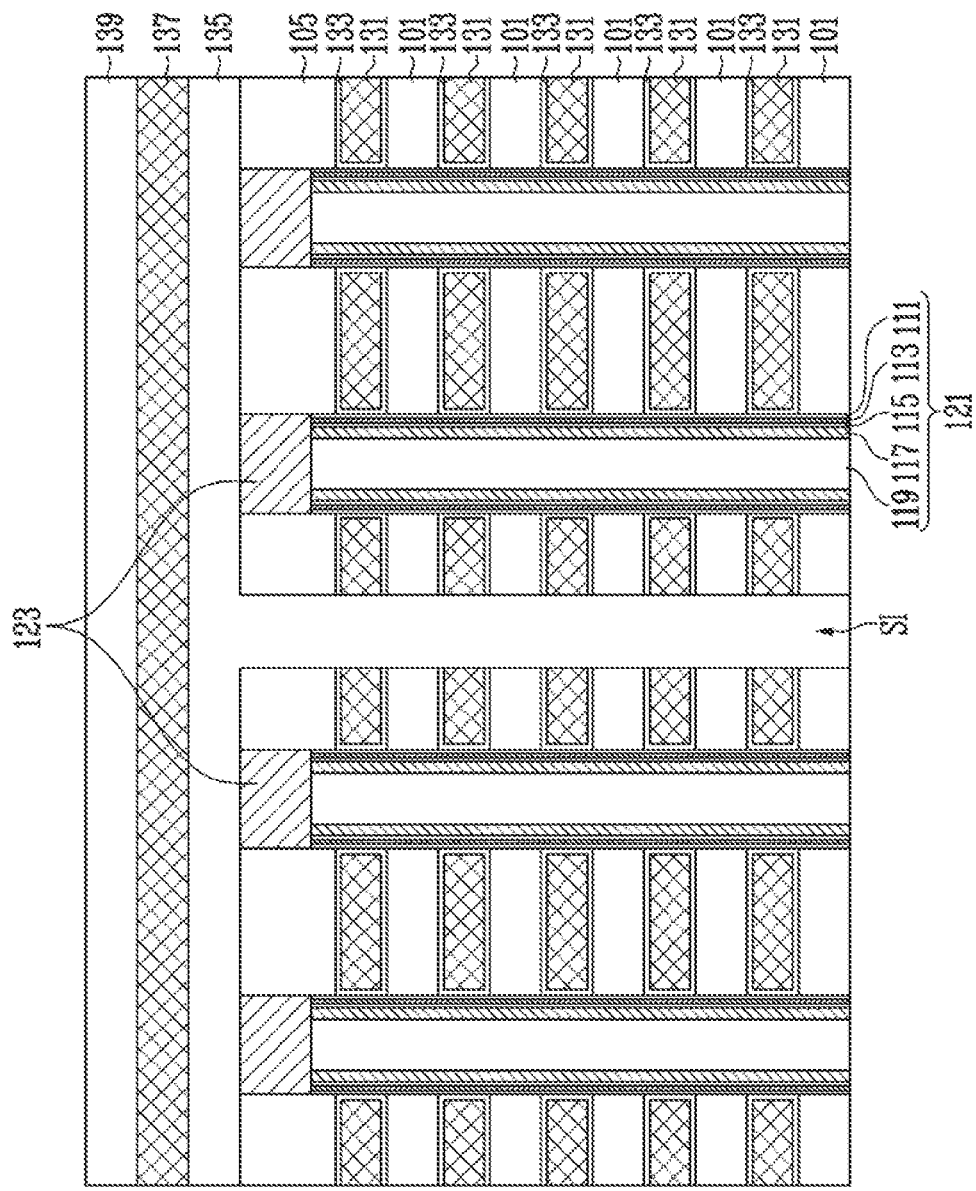

Referring to FIG. 5G, a second interlayer insulating layer 135, a conductive layer 137, and a second interlayer insulating layer 139 may be sequentially formed on the entire structure including the first interlayer insulating layer 105 and the capping layer 123. The slit SI may be filled by the second interlayer insulating layer 135.

In an embodiment, the conductive layer 137 may include a conductive material such as polysilicon doped with an N-type impurity, tungsten, tungsten silicide, molybdenum, or a metal.

Figure 5H:
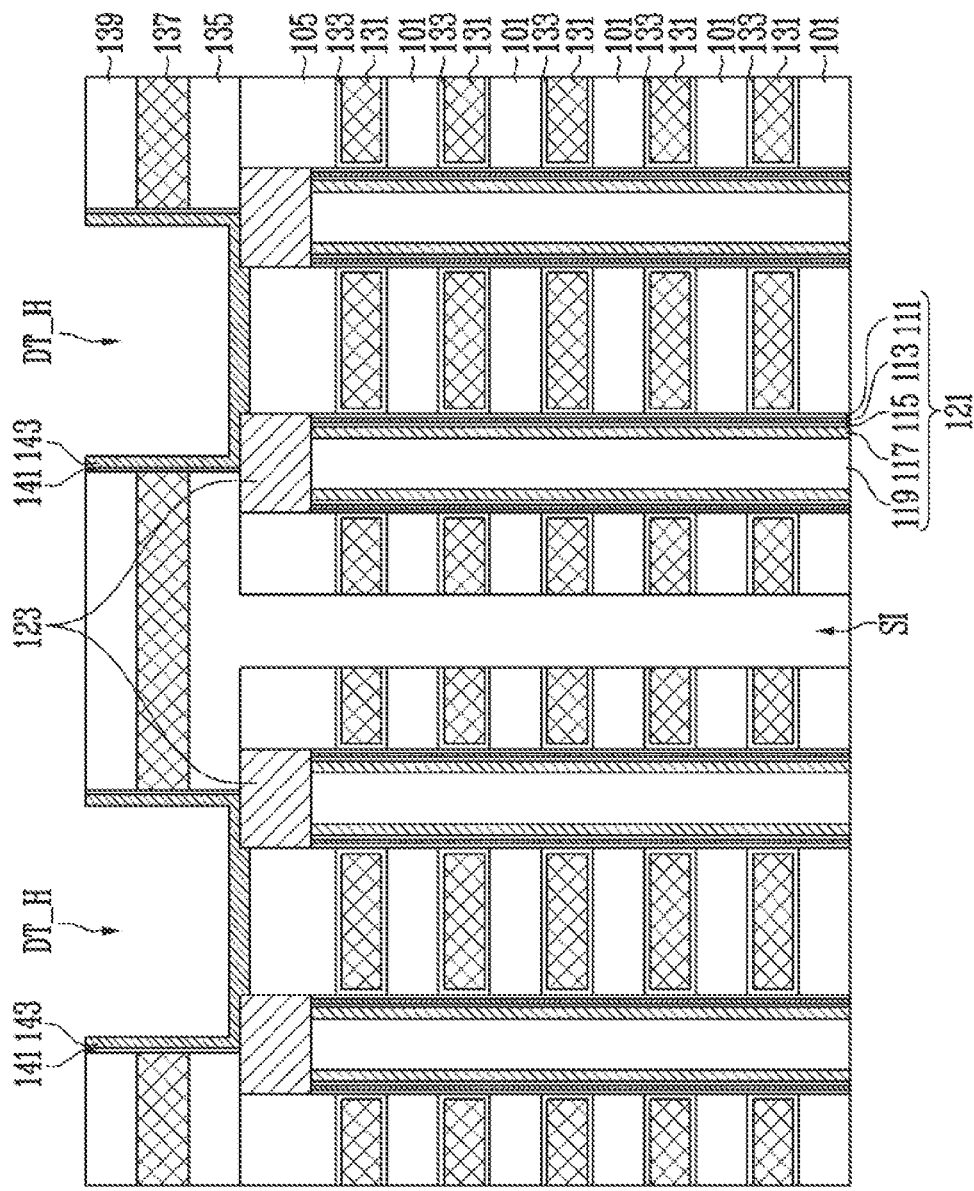

Referring to FIG. 5H, drain select transistor pattern holes DT_H are formed by etching the second interlayer insulating layer 139, the conductive layer 137, and the second interlayer insulating layer 135 so that an upper surface of the two adjacent capping layers 123 are exposed. Each of the drain select transistor pattern holes DT_H may be formed in an elliptical cylindrical structure.

In an embodiment of the present disclosure, each of the drain select transistor pattern holes DT_H is formed to expose the upper surface of the two adjacent capping layers 123, but in another embodiment, each of the drain select transistor pattern holes may be formed so that the upper surface of one capping layer 123 is exposed in correspondence with one vertical channel structure.

Thereafter, a gate insulating layer 141 is formed on a sidewall of each of the drain select transistor pattern holes DT_H. That is, the gate insulating layer 141 is formed on a curved sidewall of each of the drain select transistor pattern holes DT_H. The gate insulating layer 141 may be formed of an oxide layer or an ONO layer in which an oxide layer, a nitride layer, and an oxide layer are sequentially stacked.

Thereafter, a first channel layer 143 is formed on a bottom surface of each of the drain select transistor pattern holes DT_H and a sidewall of the gate insulating layer 141. The first channel layer 143 is in contact with the capping layer 123 of the vertical channel structure 121. The first channel layer 143 may be formed as a polysilicon layer. After forming the first channel layer 143, boron may be injected into the first channel layer 143 to prevent a leakage current.

FIG. 5I is a plan view of a semiconductor memory device on which the process step related to FIG. 5H described above is performed. Referring to FIG. 5I, each of the drain select transistor pattern holes DT_H may overlap the capping layer 123 of two vertical channel structures adjacent to each other. Each of the drain select transistor pattern holes DT_H may have an elliptical shape. In an embodiment of the present disclosure, it is illustrated that one drain select transistor pattern hole DT_H overlaps the capping layer 123 of two vertical channel structures adjacent in a diagonal direction, but one drain select transistor pattern hole DT_H may overlap the capping layer 123 of two vertical channel structures adjacent in a horizontal or vertical direction. In addition, in another embodiment, one drain select transistor pattern hole DT_H may overlap the capping layer 123 of one vertical channel structure.

Figure 5J:
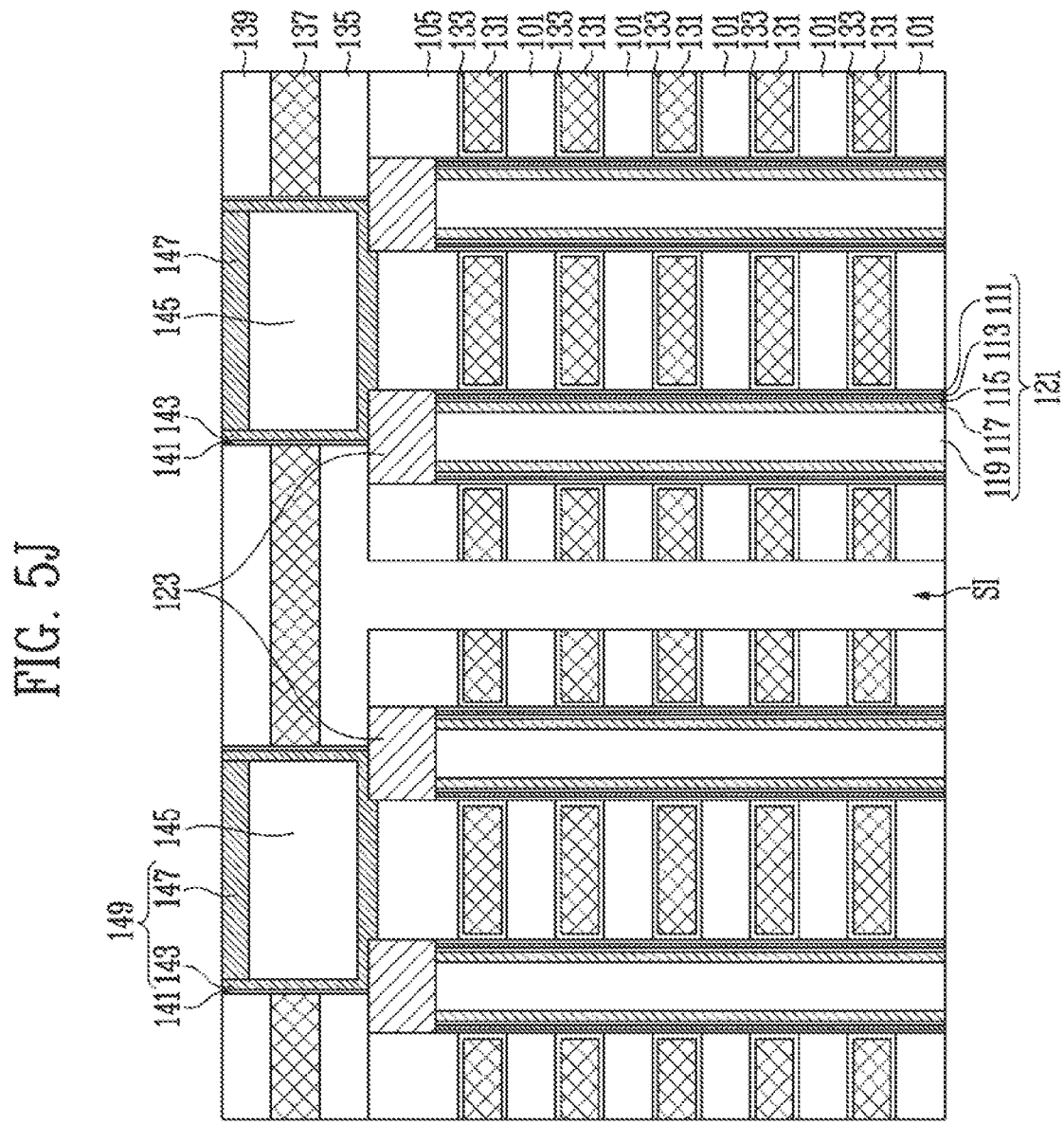

Referring to FIG. 5J, an insulating pattern 145 is formed by filling an insulating material inside the drain select transistor pattern holes DT_H of FIG. 5I. Thereafter, a second channel layer 147 covering an upper portion of the insulating pattern 145 and being in contact with the first channel layer 143 is formed. The second channel layer 147 may be formed of a polysilicon layer. A sidewall, an upper surface, and a lower surface of the insulating pattern 145 are covered by the first channel layer 143 and the second channel layer 147. After forming the second channel layer 147, boron may be injected into the second channel layer 147 to prevent a leakage current. The first channel layer 143 and the second channel layer 147 may be a channel layer 149 for the drain select transistor.

Figure 5K:
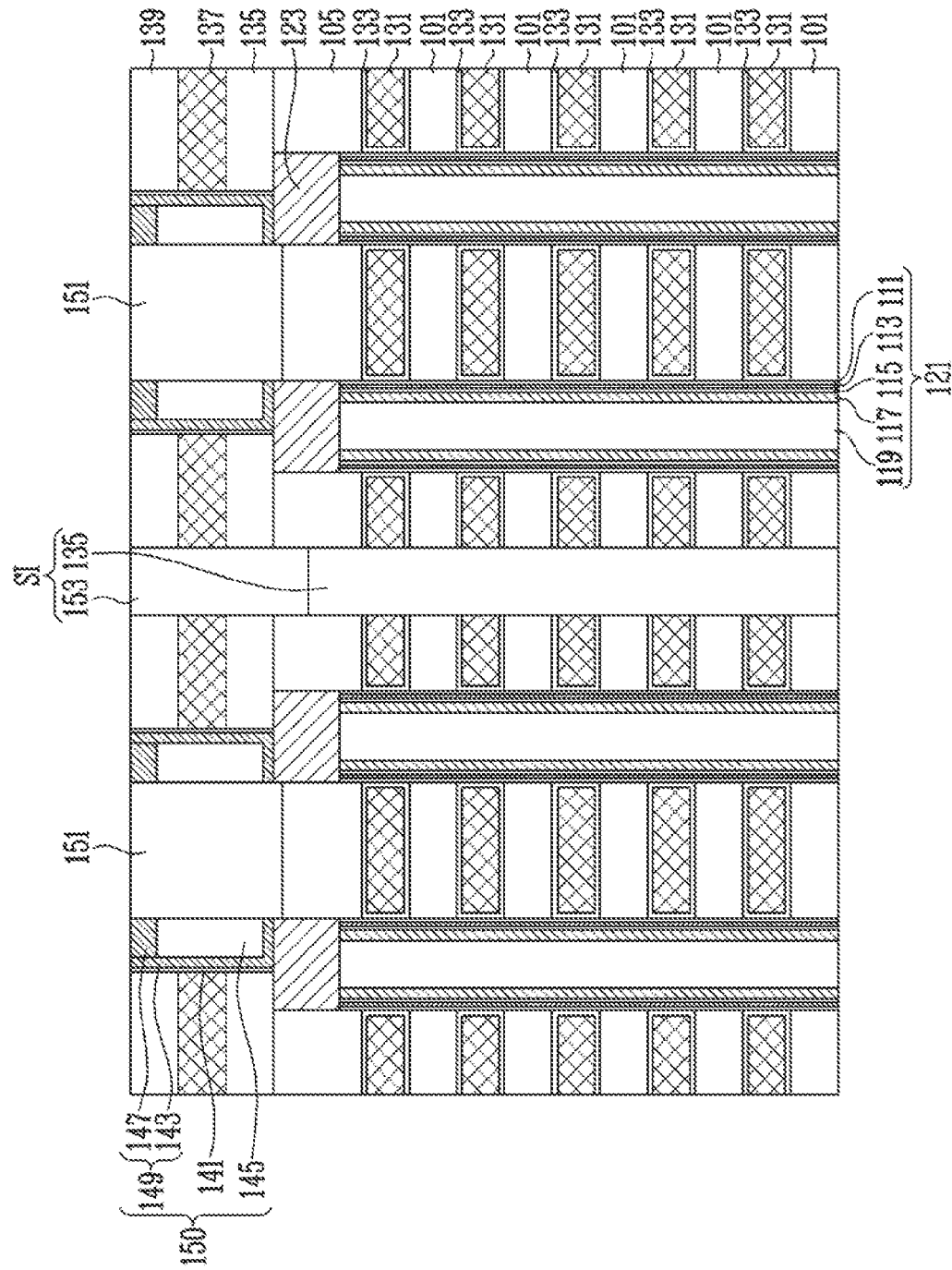

Referring to FIG. 5K, a separation pattern 151 passing through the second interlayer insulating layer 139, the conductive layer 137, and the second interlayer insulating layer 135 is formed. The separation pattern 151 may pass through the drain select transistor pattern holes in a line shape. Accordingly, the gate insulating layer 141, the first channel layer 143, the second channel layer 147, and the insulating pattern 145 formed inside the drain select transistor pattern hole may be separated into both ends by the separation pattern 151, and each of one end and the other end of the both ends is in contact with the capping layer 123 which is an upper end of a corresponding vertical channel structure 121. In addition, the conductive layer 137 surrounding a side surface of the gate insulating layer 141 may be patterned and separated by the separation pattern 151 of the line shape. That is, the conductive layer 137 extending in one side direction and the conductive layer 137 extending in the other side direction based on the separation pattern 151 may be separated from each other.

That is, an etching process is performed to form a trench in which the first interlayer insulating layer 105 between the adjacent vertical channel structures 121 is exposed, and the trench separates the gate insulating layer 141, the first channel layer 143, the second channel layer 147, and the insulating pattern 145 formed inside the drain select transistor pattern hole into the both ends. Thereafter, the separation pattern 151 may be formed by filling the trench with an insulating material.

The gate insulating layer 141, the first channel layer 143, the second channel layer 147, and the insulating pattern 145 separated to the both ends may be defined as a drain select plug 150 of the memory cell array. A curved sidewall of the drain select plug 150 is in contact with the conductive layer 137, and a planar sidewall of the drain select plug 150 is in contact with the separation pattern 151.

As described above, according to an embodiment of the present disclosure, the vertical channel structure 121 defined as the cell plug is formed in a cylindrical shape, and the drain select plug 150 is formed on the vertical channel structure 121. One sidewall of the drain select plug 150 may form a curved surface and another sidewall may form a flat surface. That is, the drain select plug 150 may be formed in a semi-cylindrical shape.

Thereafter, the second interlayer insulating layer 139, the conductive layer 137, and the second interlayer insulating layer 135 disposed on an upper end of the slit SI are etched, and an insulating material 153 is filled in the etched region. Accordingly, the slit SI may be filled with the second interlayer insulating layer 135 and the insulating material 153.

Referring to FIG. 5L, an upper interlayer insulating layer 161 is formed on the second interlayer insulating layer 139. Thereafter, the contact plugs CT passing through the upper interlayer insulating layer 161 to be in contact with an upper portion of the drain select plug 150 may be formed. The contact plugs CT may be connected to the bit lines in a subsequent process.

FIGS. 6A to 6I are cross-sectional views of a semiconductor memory device illustrating a method of manufacturing the semiconductor memory device according to another embodiment of the present disclosure.

Referring to FIG. 6A, a first stack ST1 in which first interlayer insulating layers 201 and 205 and sacrificial layers 203 are alternately stacked may be formed. The first stack ST1 may be formed on a substrate (not shown) including a peripheral circuit.

The sacrificial layers 203 may be formed of a material different from that of the first interlayer insulating layers 201 and 205. For example, the first interlayer insulating layers 201 and 205 may be formed of an oxide such as a silicon oxide layer. The sacrificial layers 203 may be formed of a material of which an etch rate is different from that of the interlayer insulating layers 201 and 205. For example, the sacrificial layers 203 may be formed of a nitride such as a silicon nitride layer.

The first interlayer insulating layer 205 disposed at the uppermost portion may be formed to be thicker than the remaining interlayer insulating layers 201.

Figure 6B:
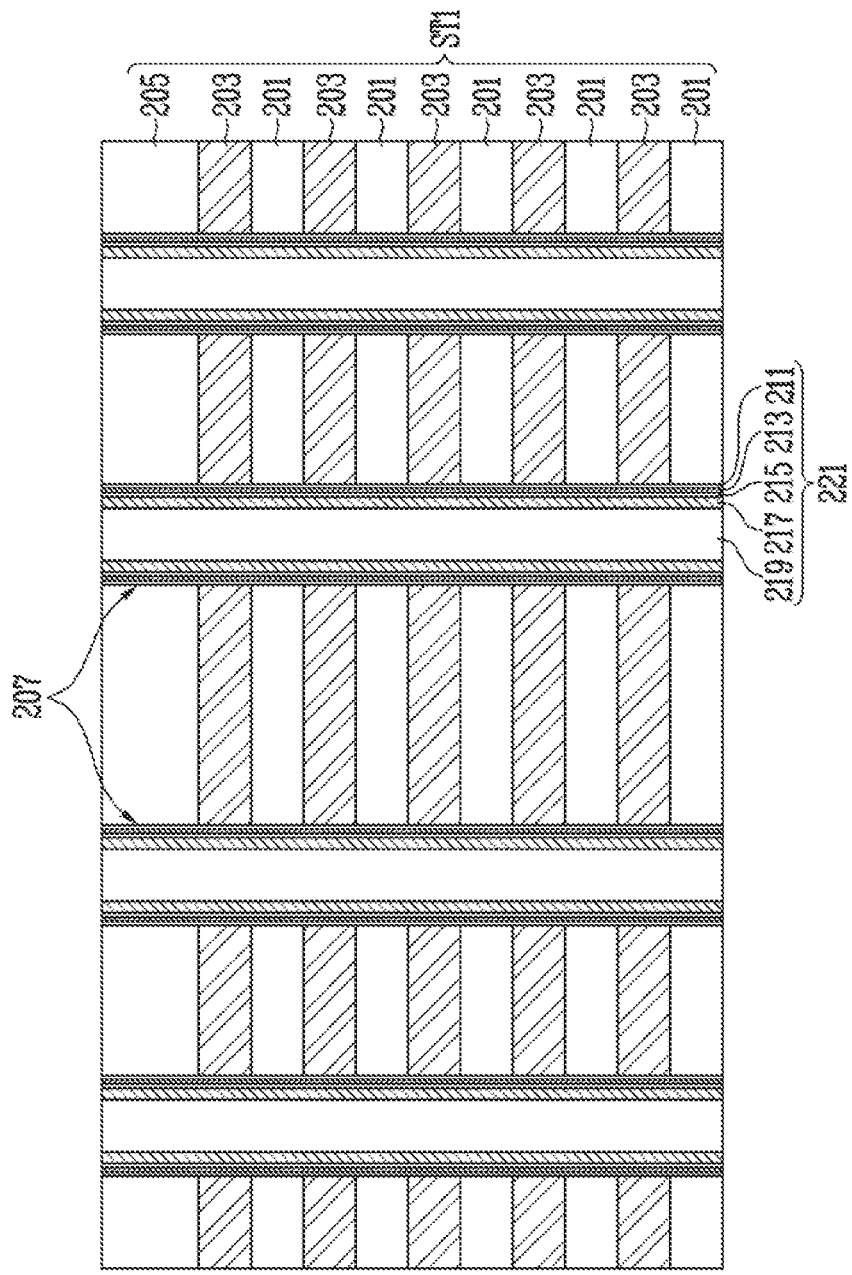

Referring to FIG. 6B, a mask pattern (not shown) in which a region where a vertical channel structure is to be formed is formed on the first stack ST1, and an etching process using the mask pattern is performed to form a plurality of channel holes 207 passing through the first stack ST1.

Thereafter, a vertical channel structure 221 is formed in each of the channel holes 207. The vertical channel structure 221 may be formed by sequentially stacking a first blocking insulating layer 211, a data storage layer 213, a tunnel insulating layer 215, a channel layer 217, and a core insulating layer 219 on a sidewall of each of the channel holes 207.

The first blocking insulating layer 211 may be formed on a sidewall of each of the channel holes 207. The first blocking insulating layer 211 may include an oxide layer capable of charge blocking. In an embodiment, the blocking insulating layer may be formed of aluminum oxide $Al_2O_3$. The data storage layer 213 may be formed on a sidewall of the first blocking insulating layer 211. The data storage layer 213 may be formed of a charge trap layer, a material layer including a conductive nanodot, or a phase change material layer. For example, the data storage layer 213 may store data changed using Fowler-Nordheim tunneling. To this end, the data storage layer 213 may be formed of a silicon nitride layer capable of charge trapping. The tunnel insulating layer 215 may be formed on a sidewall of the data storage layer 213. The tunnel insulating layer 215 may be formed of a silicon oxide layer capable of charge tunneling. The channel layer 217 may be formed on a sidewall of the tunnel insulating layer 215. The channel layer 217 may include a semiconductor layer. In an embodiment, the channel layer 217 may include silicon. The core insulating layer 119 may be formed by filling a central region of the channel holes 207. The core insulating layer 219 may be formed of an oxide layer.

In the semiconductor memory device on which the process step related to FIG. 6B described above is performed, as shown in FIG. 5C, a plurality of vertical channel structures 221 may be regularly arranged to be spaced apart from each other by a predetermined distance.

The vertical channel structure 221 may be defined as the cell plug of the memory cell array. The cell plug may be a structure corresponding to the source select transistor SST and the plurality of memory cells MC1 to MCn among the cell strings CS1 and CS2 shown in FIG. 2.

Figure 6C:
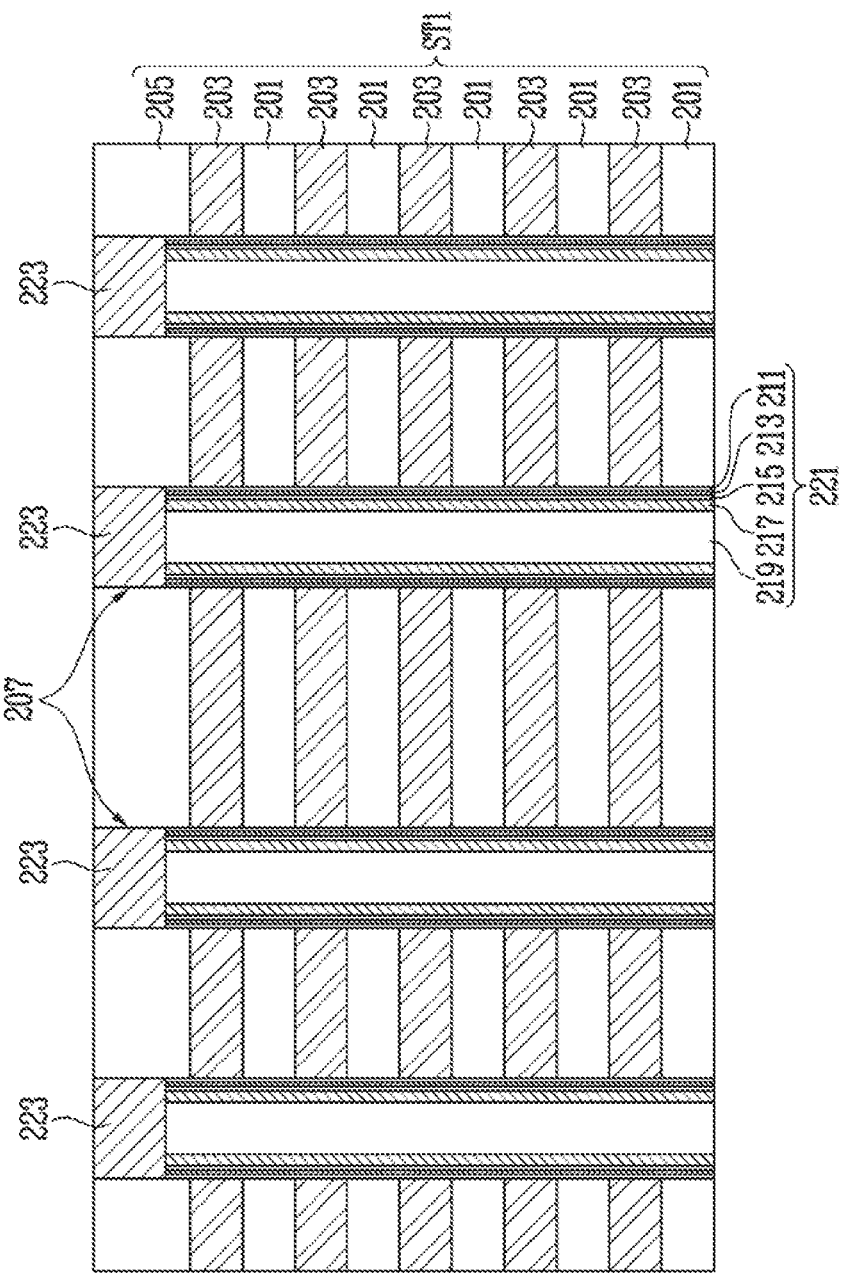

Referring to FIG. 6C, an upper portion of the plurality of vertical channel structures 221 may be etched at a predetermined thickness. For example, the upper portion of the plurality of vertical channel structures 221 may be etched at the predetermined thickness so that a height of an upper surface of the plurality of vertical channel structures 221 is higher than a height of an upper surface of the sacrificial layer 203 positioned at the uppermost portion and is lower than a height of an upper surface of the first interlayer insulating layer 205.

Thereafter, a capping layer 223 may be formed in a space where the plurality of vertical channel structures 221 are etched and removed. In an embodiment, the capping layer 223 may be formed of a doped semiconductor layer. The capping layer 223 may be defined as a configuration included in the vertical channel structure 221.

Figure 6D:
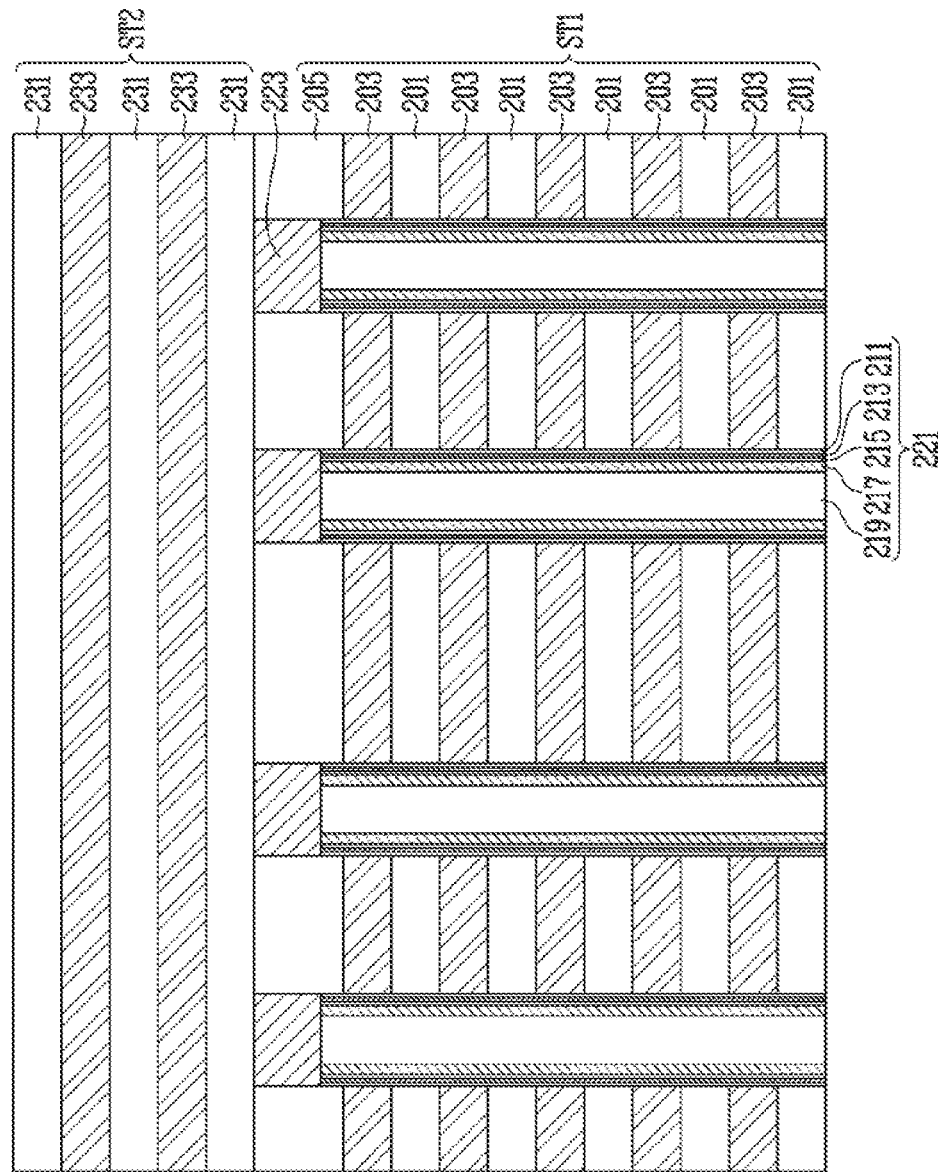

Referring to FIG. 6D, a second stack ST2 may be formed on the first stack ST1. The second stack ST2 may be formed by alternately stacking second interlayer insulating layers 231 and a sacrificial layer 233 sequentially on an upper surface of the capping layer 223 and the first interlayer insulating layer 205. The sacrificial layer 233 may be formed of the same material as the sacrificial layer 203.

Referring to FIG. 6E, the drain select transistor pattern holes DT_H are formed by etching the second stack ST2 so that an upper surface of two capping layers 223 adjacent to each other are exposed. Each of the drain select transistor pattern holes DT_H may be formed in an elliptical cylindrical structure. An elliptical shape of an elliptical cylindrical structure may have the cross-sectional shape illustrated in FIG. 5I in which one pair of opposite sides are linear and another pair of opposite sides are curved or semicircular.

In an embodiment of the present disclosure, each of the drain select transistor pattern holes DT_H is formed to expose the upper surface of the two capping layers 223 adjacent to each other, but in another embodiment, each of the drain select transistor pattern holes DT_H may be formed to expose an upper surface of one capping layer in correspondence with one vertical channel structure.

The drain select transistor pattern holes DT_H may overlap the capping layer 223 of the two vertical channel structures adjacent to each other as shown in FIG. 5I, and may be formed in an elliptical shape. In addition, one drain select transistor pattern hole DT_H may overlap the capping layer 223 of the two vertical channel structures adjacent in a diagonal direction, or one drain select transistor pattern hole DT_H may overlap the capping layer 223 of the two vertical channel structures adjacent in the horizontal or vertical direction. In addition, in another embodiment, one drain select transistor pattern hole DT_H may be formed to overlap the capping layer 223 of one vertical channel structure.

Thereafter, a gate insulating layer 241 is formed on a sidewall of each of the drain select transistor pattern holes DT_H. That is, the gate insulating layer 241 is formed on a curved sidewall of each of the drain select transistor pattern holes DT_H. The gate insulating layer 241 may be formed of an oxide layer or an ONO layer in which an oxide layer, a nitride layer, and an oxide layer are sequentially stacked.

Thereafter, a first channel layer 243 is formed on a bottom surface of each of the drain select transistor pattern holes DT_H and a sidewall of the gate insulating layer 241. The first channel layer 243 is in contact with the capping layer 223 of the vertical channel structure 221. The first channel layer 243 may be formed of a polysilicon layer.

Referring to FIG. 6F, an insulating pattern 245 is formed by filling an insulating material inside the drain select transistor pattern holes DT_H. Thereafter, a second channel layer 247 covering an upper portion of the insulating pattern 245 and being in contact with the first channel layer 243 is formed. The second channel layer 247 may be formed of a polysilicon layer. A sidewall, an upper surface, and a lower surface of the insulating pattern 245 are covered by the first channel layer 243 and the second channel layer 247. The first channel layer 243 and the second channel layer 247 may be a channel layer 249 for the drain select transistor.

Referring to FIG. 6G, a separation pattern 251 passing through the second stack ST2, the second channel layer 247, the insulating pattern 245, and the first channel layer 243 is formed. The separation pattern 251 may pass through the drain select transistor pattern holes DT_H in a linear shape. Accordingly, the gate insulating layer 241, the first channel layer 243, the second channel layer 247, and the insulating pattern 245 formed inside the drain select transistor pattern hole DT_H may be separated into two ends by the separation pattern 251, and each of the two ends may be in contact with the capping layer 223, which is an upper end of a corresponding vertical channel structure 221.

That is, an etching process is performed to form a trench in which the first interlayer insulating layer 205 between the vertical channel structures 221 adjacent to each other is exposed, and the trench separates the gate insulating layer 241, the first channel layer 243, the second channel layer 247, and the insulating pattern 245 formed inside the drain select transistor pattern hole DT_H into the two ends. Thereafter, the separation pattern 251 may be formed by filling the trench with an insulating material.

The gate insulating layer 241, the first channel layer 243, the second channel layer 247, and the insulating pattern 245 separated into the two ends may be defined as the drain select plug of the memory cell array. A curved sidewall of the drain select plug, that is, the gate insulating layer 241 and the first channel layer 243, is in contact with the sacrificial layer 233, and a planar sidewall, that is, the insulating pattern 245, is in contact with the separation pattern 251.

As described above, according to an embodiment of the present disclosure, the vertical channel structure 221 defined as the cell plug is formed in a cylindrical shape, and the drain select plug is formed on the vertical channel structure 221. One sidewall of the drain select plug may form a curved surface and another sidewall may form a flat surface. That is, the drain select plug may be formed in a semi-cylindrical shape.

Referring to FIG. 6H, a slit SI passing through the second stack between the separation patterns 251 and the first stack between the vertical channel structures 221 is formed. A sidewall of the sacrificial layers 203 and 233 shown in FIG. 6G may be exposed by the slit SI. Thereafter, the sacrificial layers 203 and 233 shown in FIG. 6G may be removed through the slit SI. Accordingly, openings exposing a side of the vertical channel structure 221 and openings exposing a side of the gate insulating layer 241 may be formed. The openings may be defined between the first interlayer insulating layers 201 and 205 and between the second interlayer insulating layers 231.

Figure 6I:
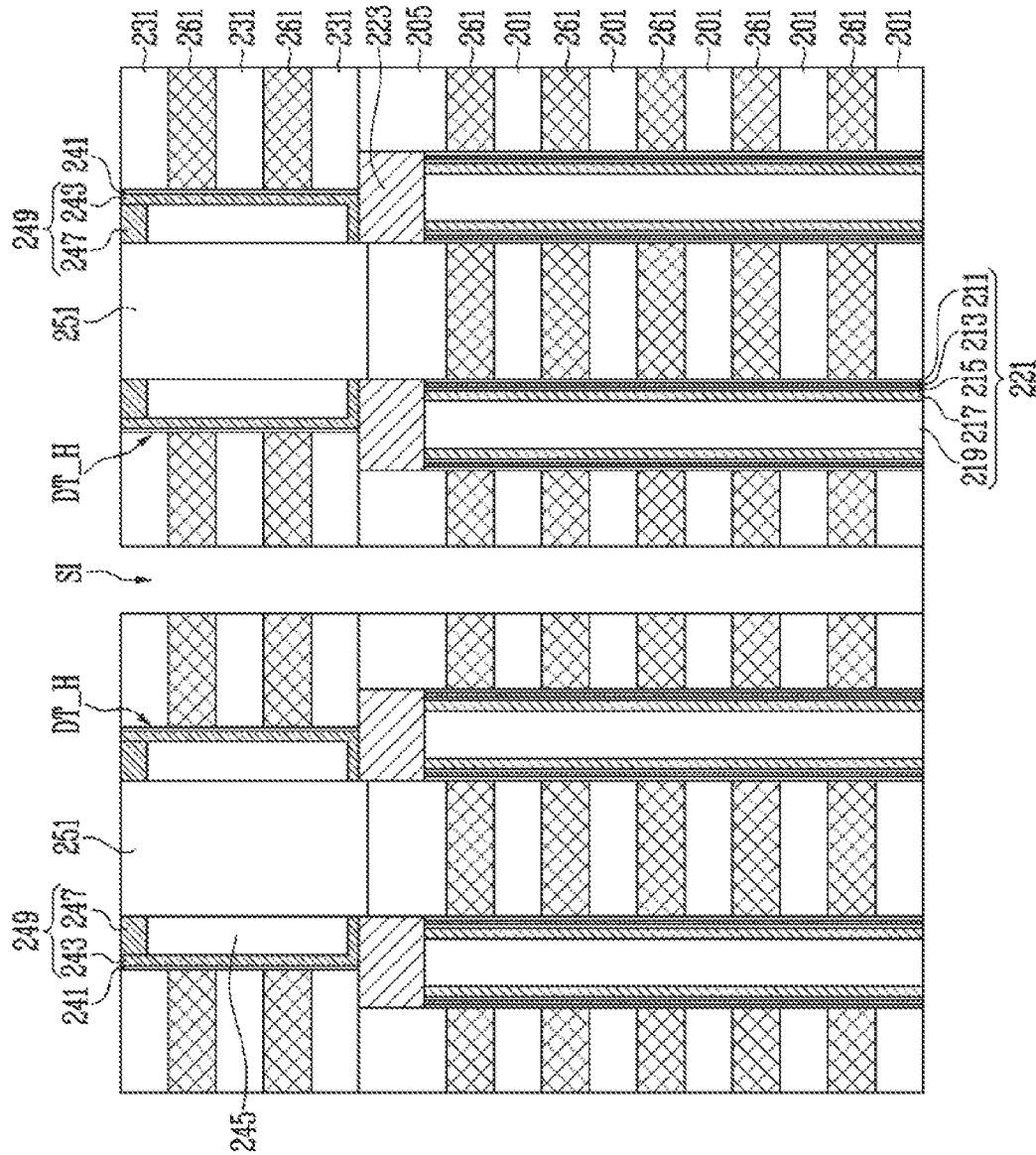

Referring to FIG. 6I, conductive layers 261 may be filled in a space where the sacrificial layers are removed, that is, the openings. For example, after a conductive material is deposited to fill the openings, the conductive material inside the slit SI may be removed so that the conductive material is separated into the conductive layers 261 by the slit SI.

After the above-described process, the slit SI may be filled with an insulating material, and the contact plugs that are in contact with the second channel layer 247 may be formed as shown in FIG. 5L described above.

As described above, according to an embodiment of the present disclosure, after forming one elliptical cylindrical gate pattern for the drain select transistor on at least one vertical channel structure, the gate pattern for the drain select transistor and the separation pattern for separating the conductive layer for the drain select line are formed. Accordingly, during an etching process for forming the separation pattern, by etching the gate pattern for the drain select transistor of which a critical dimension is relatively larger than a critical dimension of the vertical channel structure, an alignment margin of the etching process may be easily secured.

Figure 7:
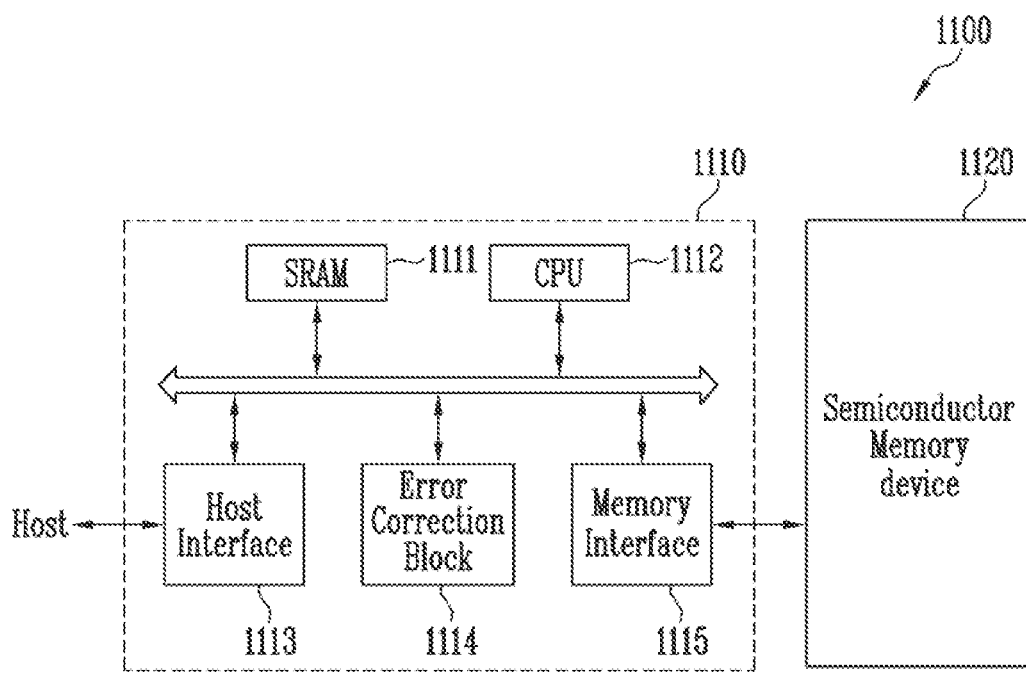
FIG. 7 is a block diagram illustrating a configuration of a memory system according to an embodiment of the present disclosure.

FIG. 7 is a block diagram illustrating a configuration of a memory system 1100 according to an embodiment of the present disclosure.

Referring to FIG. 7, the memory system 1100 includes a semiconductor memory device 1120 and a memory controller 1110.

The semiconductor memory device 1120 may be configured identically to the semiconductor memory device shown in FIGS. 1 to 4.

The semiconductor memory device 1120 may be a multi-chip package configured of a plurality of flash memory chips.

The memory controller 1110 may be configured to control the semiconductor memory device 1120, and may include static random access memory (SRAM) 1111, a central processing unit (CPU) 1112, a host interface 1113, an error correction block 1114, and a memory interface 1115. The SRAM 1111 is used as operation memory of the CPU 1112, the CPU 1112 performs an overall control operation for data exchange of the memory controller 1110, and the host interface 1113 includes a data exchange protocol of a host connected to the memory system 1100. In addition, the error correction block 1114 detects and corrects errors included in data read from the semiconductor memory device 1120, and the memory interface 1115 performs interfacing with the semiconductor memory device 1120. In addition, the memory controller 1110 may further include read only memory (ROM) that stores code data for interfacing with the host.

Figure 8:
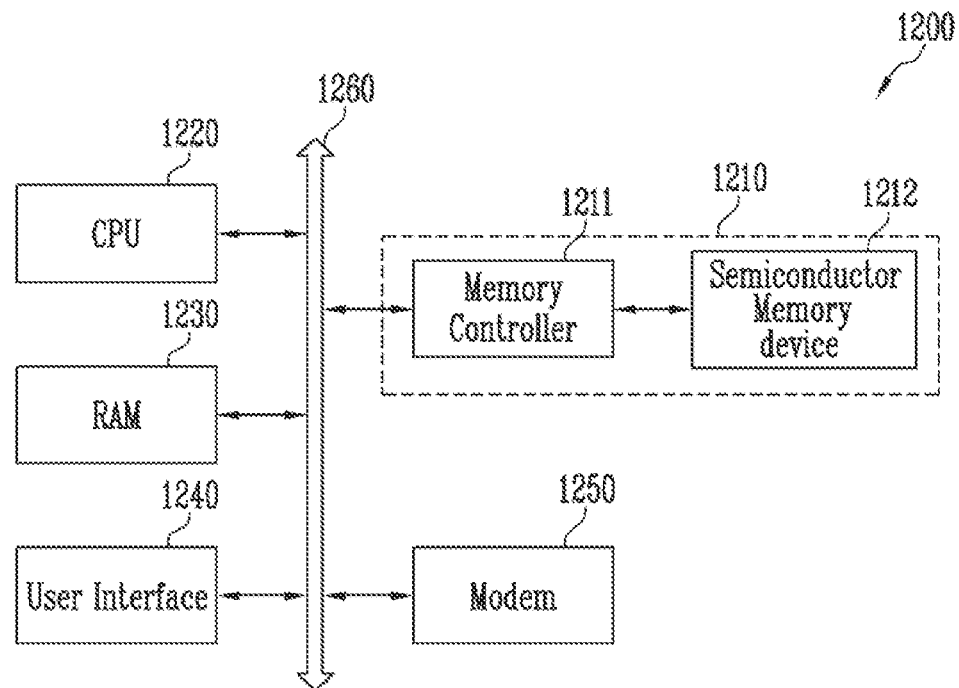
FIG. 8 is a block diagram illustrating a configuration of a computing system according to an embodiment of the present disclosure.

FIG. 8 is a block diagram illustrating a configuration of a computing system 1200 according to an embodiment.

Referring to FIG. 8, the computing system 1200 according to an embodiment of the present disclosure may include a CPU 1220, random access memory (RAM) 1230, a user interface 1240, a modem 1250, and a memory system 1210 electrically connected to a system bus 1260. The computing system 1200 may be a mobile device.

The memory system 1210 may include a memory semiconductor device 1212 and a memory controller 1211. The semiconductor memory device 1212 may be configured identically to the semiconductor memory device shown in FIGS. 1 to 4.

Although the detailed description of the present disclosure describes specific embodiments, various changes and modifications are possible without departing from the scope and technical spirit of the present disclosure. Therefore, the scope of the present disclosure should not be limited to the above-described embodiments, and should be determined by the following claims and their equivalents.

What is claimed is:

1. A semiconductor memory device comprising:
    a lower stack in which a plurality of first interlayer insulating layers and first conductive layers are alternately stacked;
    a plurality of cell plugs passing through the lower stack in a vertical direction;
    an upper stack in which a plurality of second interlayer insulating layers and at least one second conductive layer are alternately stacked on the lower stack;
    a plurality of drain select plugs passing through the upper stack and being in contact with an upper portion of the plurality of cell plugs;
    a plurality of capping layers disposed between the plurality of cell plugs and the plurality of drain select plugs; and
    a separation pattern separating adjacent drain select plugs among the plurality of drain select plugs, wherein the separation pattern is in contact with a sidewall of each of the adjacent drain select plugs.

2. The semiconductor memory device of claim 1, wherein each of the plurality of drain select plugs includes a sidewall forming a flat surface and a sidewall forming a curved surface.

3. The semiconductor memory device of claim 2, wherein the at least one second conductive layer is in contact with the sidewall forming the curved surface of each of the drain select plugs.

4. The semiconductor memory device of claim 3, wherein in the at least one second conductive layer, a region extending in a first side direction and a region extending in a second side direction in relation to the separation pattern are separated from each other.

5. The semiconductor memory device of claim 1, wherein the plurality of cell plugs have a cylindrical structure.

6. The semiconductor memory device of claim 5, wherein each of the plurality of cell plugs includes:
a channel layer extending in the vertical direction;
a tunnel insulating layer surrounding a sidewall of the channel layer;
a data storage layer surrounding a sidewall of the tunnel insulating layer; and
a blocking insulating layer surrounding a sidewall of the data storage layer.

7. The semiconductor memory device of claim 6, wherein each of the plurality of capping layers is formed on the channel layer, the tunnel insulating layer, the data storage layer, and the blocking insulating layer of each of the plurality of cell plugs.

8. The semiconductor memory device of claim 1, wherein each of the plurality of drain select plugs comprises:
an insulating pattern having a first sidewall that is in contact with the separation pattern;
a channel layer surrounding a second sidewall, an upper surface, and a lower surface of the insulating pattern; and
a gate insulating layer surrounding a sidewall of the channel layer.

9. The semiconductor memory device of claim 8, wherein the channel layer of each of the plurality of drain select plugs is in contact with each of the plurality of cell plugs.

10. A method of manufacturing a semiconductor memory device, the method comprising:
forming a plurality of cell plugs passing through a lower stack in which a plurality of first interlayer insulating layers and a plurality of first conductive layers are alternately stacked in a vertical direction;
forming a space by partially etching and removing an upper portion of each of the plurality of cell plugs and forming a capping layer in the space;
forming an upper stack in which a plurality of second interlayer insulating layers and at least one second conductive layer are alternately stacked on the lower stack;
etching the upper stack to form a plurality of drain select transistor pattern holes, each drain select transistor pattern hole exposing an upper portion of at least one of the plurality of cell plugs;
forming a drain select plug in each of the plurality of drain select transistor pattern holes; and
forming a separation pattern passing through the upper stack in a linear shape and separating the drain select plug into two ends.

11. The method of claim 10, wherein forming the drain select plug in each of the plurality of drain select transistor pattern holes comprises:
forming a gate insulating layer on a sidewall of the plurality of drain select transistor pattern holes;
forming a first channel layer on a lower surface of the plurality of drain select transistor pattern holes and on a sidewall of the gate insulating layer;
filling an inside of the plurality of drain select transistor pattern holes with an insulating pattern; and
forming a second channel layer covering an upper portion of the insulating pattern and connected to the first channel layer.

12. The method of claim 11, wherein the drain select plug is formed in an elliptical cylindrical structure.

13. The method of claim 12, wherein forming the separation pattern comprises:
forming a trench having a linear shape separating the drain select plug into the two ends; and
filling the trench with an insulating material to form the separation pattern,
wherein a sidewall of the insulating pattern exposed by the trench and the separation pattern are in contact with each other.

14. The method of claim 13, wherein the drain select plug separated into the two ends by the separation pattern has a curved sidewall and a planar sidewall.

15. The method of claim 14, wherein the second conductive layer is in contact with the curved sidewall of the drain select plug, and the separation pattern is in contact with the planar sidewall of the drain select plug.

16. A method of manufacturing a semiconductor memory device, the method comprising:
forming a plurality of cell plugs passing through a lower stack in which a plurality of first interlayer insulating layers and a plurality of first sacrificial layers are alternately stacked in a vertical direction;
forming a space by partially etching and removing an upper portion of each of the plurality of cell plugs and forming a capping layer in the space;
forming an upper stack in which a plurality of second interlayer insulating layers and a plurality of second sacrificial layers are alternately stacked on the lower stack;
etching the upper stack to form a plurality of drain select transistor pattern holes, each drain select transistor pattern hole exposing an upper portion of at least one of the plurality of cell plugs;
forming a drain select plug in each of the plurality of drain select transistor pattern holes;
forming a separation pattern passing through the upper stack in a linear shape and separating the drain select plug into two ends;
forming a slit passing through the upper stack and the lower stack to expose the first sacrificial layers and the second sacrificial layers, and removing the exposed first sacrificial layers and second sacrificial layers; and
forming a conductive pattern in a space where the first sacrificial layers and the second sacrificial layers are removed.

17. The method of claim 16, wherein forming the drain select plug in each of the plurality of drain select transistor pattern holes comprises:
forming a gate insulating layer on a sidewall of the plurality of drain select transistor pattern holes;
forming a first channel layer on a lower surface of the plurality of drain select transistor pattern holes and on a sidewall of the gate insulating layer;
filling an inside of the plurality of drain select transistor pattern holes with an insulating pattern; and
forming a second channel layer covering an upper portion of the insulating pattern and connected to the first channel layer.

18. The method of claim 17, wherein the drain select plug is formed in an elliptical cylindrical structure.

19. The method of claim 18, wherein forming the separation pattern comprises:
forming a trench having a linear shape separating the drain select plug into the two ends; and filling the trench with an insulating material to form the separation pattern, wherein a sidewall of the insulating pattern exposed by the trench and the separation pattern are in contact with each other.

20. The method of claim 19, wherein the drain select plug separated into the two ends by the separation pattern has a curved sidewall and a planar sidewall.

* * * * *